US011569299B2

(12) United States Patent
Hong et al.

(10) Patent No.: US 11,569,299 B2
(45) Date of Patent: Jan. 31, 2023

(54) DISPLAY DEVICE INCLUDING LIGHT-EMITTING PORTIONS HAVING OPPOSING ANGLE DIRECTIONS

(71) Applicant: Samsung Display Co., Ltd., Yongin-si (KR)

(72) Inventors: Sang Min Hong, Cheonan-si (KR); Wonju Kwon, Hwaseong-si (KR); Heeseong Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 113 days.

(21) Appl. No.: 16/953,003

(22) Filed: Nov. 19, 2020

(65) Prior Publication Data

US 2021/0288119 A1    Sep. 16, 2021

(30) Foreign Application Priority Data

Mar. 10, 2020 (KR) .................. 10-2020-0029701

(51) Int. Cl.
*H01L 27/32* (2006.01)
*H01L 51/50* (2006.01)
(Continued)

(52) U.S. Cl.
CPC ........ *H01L 27/3216* (2013.01); *H01L 27/323* (2013.01); *H01L 27/3244* (2013.01);
(Continued)

(58) Field of Classification Search
CPC ............... H01L 27/3216; H01L 27/323; H01L 27/3244; H01L 27/3234; H01L 27/326;
(Continued)

(56) References Cited

U.S. PATENT DOCUMENTS

| 8,698,395 | B2 | 4/2014 | Im et al. |
| 9,859,347 | B2 | 1/2018 | Jin et al. |
| 10,074,826 | B2 * | 9/2018 | Park ..................... H01L 27/3211 |
| 2010/0109511 | A1 * | 5/2010 | Kim ..................... H01L 27/3258 |
| | | | 438/34 |

(Continued)

FOREIGN PATENT DOCUMENTS

| CN | 109979391 A | 7/2019 |
| KR | 10-2004-0098238 A | 11/2004 |

(Continued)

OTHER PUBLICATIONS

Extended European Search Report issued in corresponding application No. EP21160685.0, dated Aug. 16, 2021, 8 pages.

*Primary Examiner* — Ida M Soward
(74) *Attorney, Agent, or Firm* — Lewis Roca Rothgerber Christie LLP

(57) ABSTRACT

A display device includes a display panel having first and second regions with the second region having a higher resolution than the first region and an electronic module under the first region. The display panel includes first and second emission layers in a first sub-region of the first region with the second emission layer being spaced apart from the first emission layer. The first emission layer has a first light-emitting portion and a second light-emitting portion adjacent to the first light-emitting portion in a first direction, and the second emission layer has a third light-emitting portion and a fourth light-emitting portion adjacent to the third light-emitting portion in the first direction. The first light-emitting portion is inclined from the second light-emitting portion toward a lower surface of the display panel, and the fourth light-emitting portion is inclined from the third light-emitting portion toward an upper surface of the display panel.

22 Claims, 29 Drawing Sheets

(51) Int. Cl.
*H01L 51/52* (2006.01)
*H01L 27/14* (2006.01)
*H01L 27/146* (2006.01)

(52) U.S. Cl.
CPC ...... *H01L 27/14678* (2013.01); *H01L 27/322* (2013.01); *H01L 51/5056* (2013.01); *H01L 51/5072* (2013.01); *H01L 51/5088* (2013.01); *H01L 51/5092* (2013.01); *H01L 2251/301* (2013.01)

(58) Field of Classification Search
CPC ............. H01L 27/3218; H01L 27/3246; H01L 27/3262; H01L 27/322; H01L 27/14678; H01L 51/52; H01L 51/5072; H01L 51/5056; H01L 51/5088; H01L 51/5092; H01L 2251/558; H01L 2251/301
See application file for complete search history.

(56) References Cited

U.S. PATENT DOCUMENTS

| | | |
|---|---|---|
| 2011/0121719 A1 | 5/2011 | Yokoyama et al. |
| 2012/0256204 A1* | 10/2012 | Yoshizumi .......... H01L 51/0023 257/E33.059 |
| 2018/0076270 A1 | 3/2018 | Kwon et al. |
| 2018/0182827 A1 | 6/2018 | Kim |
| 2019/0181365 A1* | 6/2019 | Choi .................. H01L 51/5253 |
| 2019/0305055 A1* | 10/2019 | Kim .................. H01L 27/3248 |
| 2021/0126226 A1* | 4/2021 | Ushikubo .......... H01L 27/3211 |

FOREIGN PATENT DOCUMENTS

| | | |
|---|---|---|
| KR | 10-0700013 B1 | 3/2007 |
| KR | 10-2012-0140542 A | 12/2012 |
| KR | 10-2014-0072711 A | 6/2014 |
| KR | 10-2018-0075958 A | 7/2018 |

\* cited by examiner

DISPLAY DEVICE INCLUDING LIGHT-EMITTING PORTIONS HAVING OPPOSING ANGLE DIRECTIONS

CROSS-REFERENCE TO RELATED APPLICATION

This application claims priority to and the benefit of Korean Patent Application No. 10-2020-0029701, filed in the Korean Intellectual Property Office on Mar. 10, 2020, the entire content of which is hereby incorporated by reference.

BACKGROUND

1. Field

Aspects of embodiments of the present disclosure relate to a display device.

2. Description of Related Art

A display device may include various electronic components, such as a display panel, an electronic module, etc. The electronic module may include a camera, an infrared detecting sensor, or a proximity sensor, etc. The electronic module may be displaced (or arranged) under the display panel. The transmittance of a partial region of (or a portion of) the display panel may be greater than the transmittance of other partial regions of (or other portions of) the display panel. The electronic module may receive an external input through the partial region of the display panel or may provide an output through the partial region of the display panel.

SUMMARY

Embodiments of the present disclosure provide a display device having improved display quality.

An embodiment of the present disclosure provides a display device including: a display panel having a first region and a second region having a higher resolution than the first region, the first region having a first sub-region and a second sub-region; and an electronic module under the first region of the display panel. The display panel includes: a first emission layer in the first sub-region; and a second emission layer in the first sub-region and spaced apart from the first emission layer. The first emission layer has a first light-emitting portion and a second light-emitting portion adjacent to the first light-emitting portion in a first direction, and the second emission layer has a third light-emitting portion and a fourth light-emitting portion adjacent to the third light-emitting portion in the first direction. The first light-emitting portion is inclined from the second light-emitting portion toward a lower surface of the display panel, and the fourth light-emitting portion is inclined from the third light-emitting portion toward an upper surface of the display panel.

The first light-emitting portion may be closer to the second sub-region than the second light-emitting portion is; and the fourth light-emitting portion may be closer to the second sub-region than the third light-emitting portion is.

The display panel may further include a third emission layer in the first sub-region. The third emission layer may be spaced apart from the second emission layer in a second direction crossing the first direction, the third emission layer may have a fifth light-emitting portion and a sixth light-emitting portion adjacent to the fifth light-emitting portion in the first direction, and the fifth light-emitting portion may be inclined from the sixth light-emitting portion toward the upper surface of the display panel.

The first emission layer may be configured to emit blue light or red light, and the second emission layer and the third emission layer may be configured to emit green light.

An angle between the third light-emitting portion and the fourth light-emitting portion and an angle between the fifth light-emitting portion and the sixth light-emitting portion may be substantially the same.

The first emission layer may be configured to emit green light, the second emission layer may be configured to emit blue light, and the third emission layer may be configured to emit red light.

An angle between the third light-emitting portion and the fourth light-emitting portion may be different from an angle between the fifth light-emitting portion and the sixth light-emitting portion.

An angle between an upper surface of the first light-emitting portion and an upper surface of the second light-emitting portion may be greater than about 180 degrees; and an angle between an upper surface of the third light-emitting portion and an upper surface of the fourth light-emitting portion may be less than about 180 degrees.

The display panel may further include: a first intermediate insulating layer in the first sub-region; and a second intermediate insulating layer in the first sub-region and between the first intermediate insulating layer and the first emission layer and between the first intermediate insulating layer and the second emission layer.

When viewed in a plane, the first intermediate insulating layer and the second intermediate insulating layer may be spaced apart from the second sub-region.

The first intermediate insulating layer may have: a first insulating portion under the first light-emitting portion; a second insulating portion under the second light-emitting portion; a third insulating portion under the third light-emitting portion; and a fourth insulating portion under the fourth light-emitting portion. The second intermediate insulating layer may have: a fifth insulating portion under the first light-emitting portion; a sixth insulating portion under the second light-emitting portion; a seventh insulating portion under the third light-emitting portion; and an eighth insulating portion under the fourth light-emitting portion. Any one from among the first to eighth insulating portions may have a different thickness from another one of the first to eighth insulating portions.

A thickness of the first insulating portion may be smaller than a thickness of the fourth insulating portion.

A thickness of the fifth insulating portion may be smaller than a thickness of the eighth insulating portion.

A thickness of the first insulating portion may be smaller than a thickness of the fourth insulating portion, and a thickness of the fifth insulating portion may be smaller than a thickness of the eighth insulating portion.

The display panel may further include a first metal pattern between the fourth insulating portion and the eighth insulating portion.

The display panel may further include a second metal pattern under the fourth insulating portion, and the fourth insulating portion may be between the first metal pattern and the second metal pattern.

The display panel may further include a metal pattern under the fourth insulating portion.

A transmittance of the second sub-region may be higher than a transmittance of the first sub-region, and the electronic module may be a camera module.

Another embodiment of the present disclosure provides a display device including: a display panel having an effective region and a transmissive region extending around a periphery of the effective region; and an electronic module under the display panel. The display panel includes: a first emission layer having a first light-emitting portion and a second light-emitting portion, the first light-emitting portion being in the effective region and adjacent to the transmissive region; and a second emission layer in the effective region and having a third light-emitting portion and a fourth light-emitting portion adjacent to the transmissive region. An angle between an upper surface of the first light-emitting portion and an upper surface of the second light-emitting portion is greater than about 180 degrees, and an angle between an upper surface of the third light-emitting portion and an upper surface of the fourth light-emitting portion is less than about 180 degrees.

The display panel may further include: a first intermediate insulating layer in the effective region; and a second intermediate insulating layer in the effective region, between the first intermediate insulating layer and the first emission layer, and between the first intermediate insulating layer and the second emission layer. A thickness from a lower surface of the first intermediate insulating layer to the first light-emitting portion may be smaller than a thickness from the lower surface of the first intermediate insulating layer to the fourth light-emitting portion.

Another embodiment of the present disclosure provides a display device including: a base layer; a circuit layer on the base layer; a first electrode on the circuit layer; and a second electrode on the circuit layer and spaced apart from the first electrode. The first electrode has a first portion and a second portion forming a first angle that is greater than about 180 degrees with the first portion, and the second electrode has a third portion and a fourth portion forming a second angle that is smaller than about 180 degrees with the third portion.

A thickness of the circuit layer overlapping the first portion may be smaller than a thickness of the circuit layer overlapping the fourth portion.

BRIEF DESCRIPTION OF THE FIGURES

The accompanying drawings are included to provide a further understanding of the present disclosure and are incorporated in and form a part of this specification. The drawings illustrate exemplary embodiments of the present disclosure and, together with the description, explain aspects and features of the present disclosure. In the drawings.

DETAILED DESCRIPTION

Figure 1:
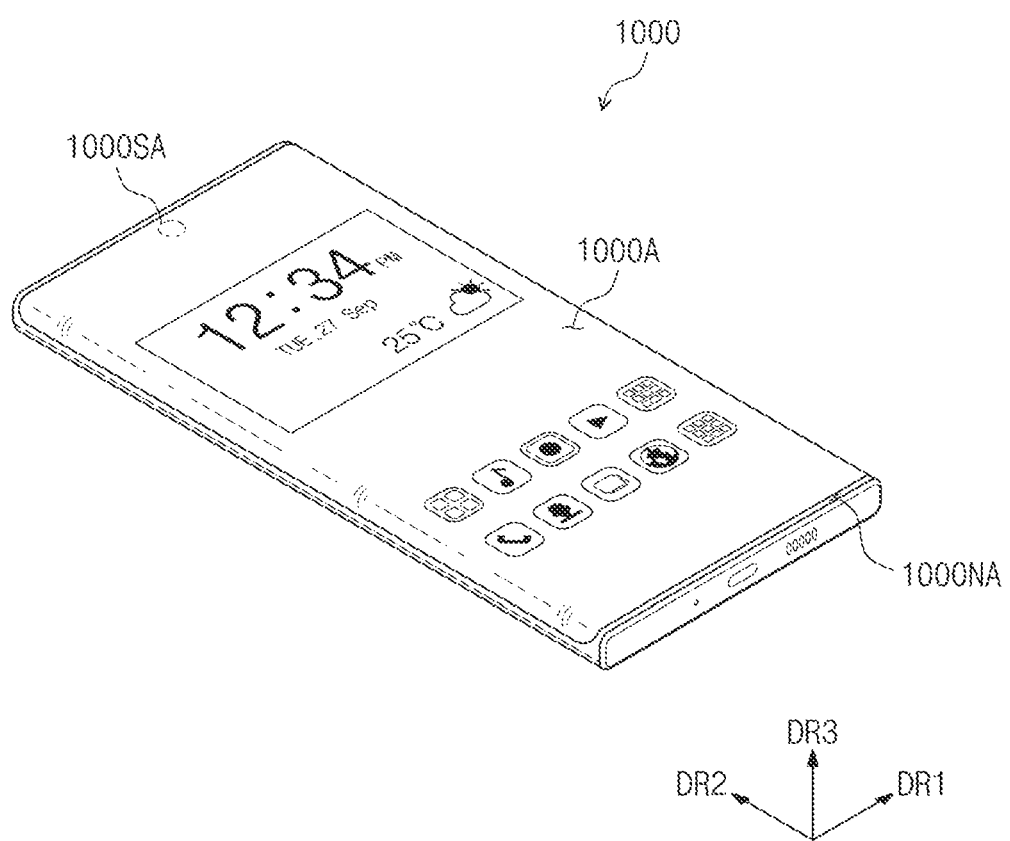
FIG. 1 is a perspective view of a display device according to an embodiment of the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Unless defined otherwise, all terms (including technical terns and scientific terms) used in the description have the same meaning as that generally understood by those skilled in the art to which the present disclosure belongs. It will be further understood that terms, such as those defined in commonly used dictionaries, should be interpreted as having a meaning that is consistent with their meaning in the context of the relevant art and will not be interpreted in an idealized or excessively formal sense unless so defined herein.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the accompanying drawings.

FIG. 1 is a perspective view of a display device according to an embodiment of the present disclosure.

Referring to FIG. 1, a display device 1000 may be a device activated in response to an electric signal. For example, the display device 1000 may be (or may be a part of) a portable phone, a tablet, a car navigation system, a game machine, and/or a wearable device, but the present disclosure is not limited thereto. FIG. 1 exemplarily illustrates that the display device 1000 is a (or is a part of a) portable phone.

The display device 1000 may display an image at an active region 1000A. The active region 1000A may be a plane defined by a first direction DR1 and a second direction DR2. The active region 1000A may have curved surfaces respectively bent away from at least two axes of the plane (e.g., bent or curved with respect to the first and second directions DR1 and DR2). However, the shape of the active region 1000A is not limited thereto. For example, the active region 1000A may be planar (or only planar), or the active region 1000A may further include one or more (e.g., four) curved surfaces respectively bent away from two or more, for example, four axes.

A sensing region 1000SA may be defined inside the active region 1000A of the display device 1000. FIG. 1 exemplarily illustrates a single sensing region 1000SA, but the number of sensing regions 1000SA is not limited thereto. The sensing region 1000SA may be a portion of the active region 1000A. Accordingly, the display device 1000 may display an image at the sensing region 1000SA.

An electronic module, for example, a camera module or a proximity illuminance sensor may be disposed in a region overlapping (e.g., aligned with) the sensing region 1000SA. The electronic module may receive an external input (e.g., light) transmitted through the sensing region 1000SA and/or may provide an output through the sensing region 1000SA.

The thickness direction of the display device 1000 may be parallel to a third direction DR3 crossing the first direction DR1 and the second direction DR2. Accordingly, the front surface (or upper surface) and the rear surface (or lower surface) of the components of the display device 1000 may be defined with respect to the third direction DR3.

Figure 2:
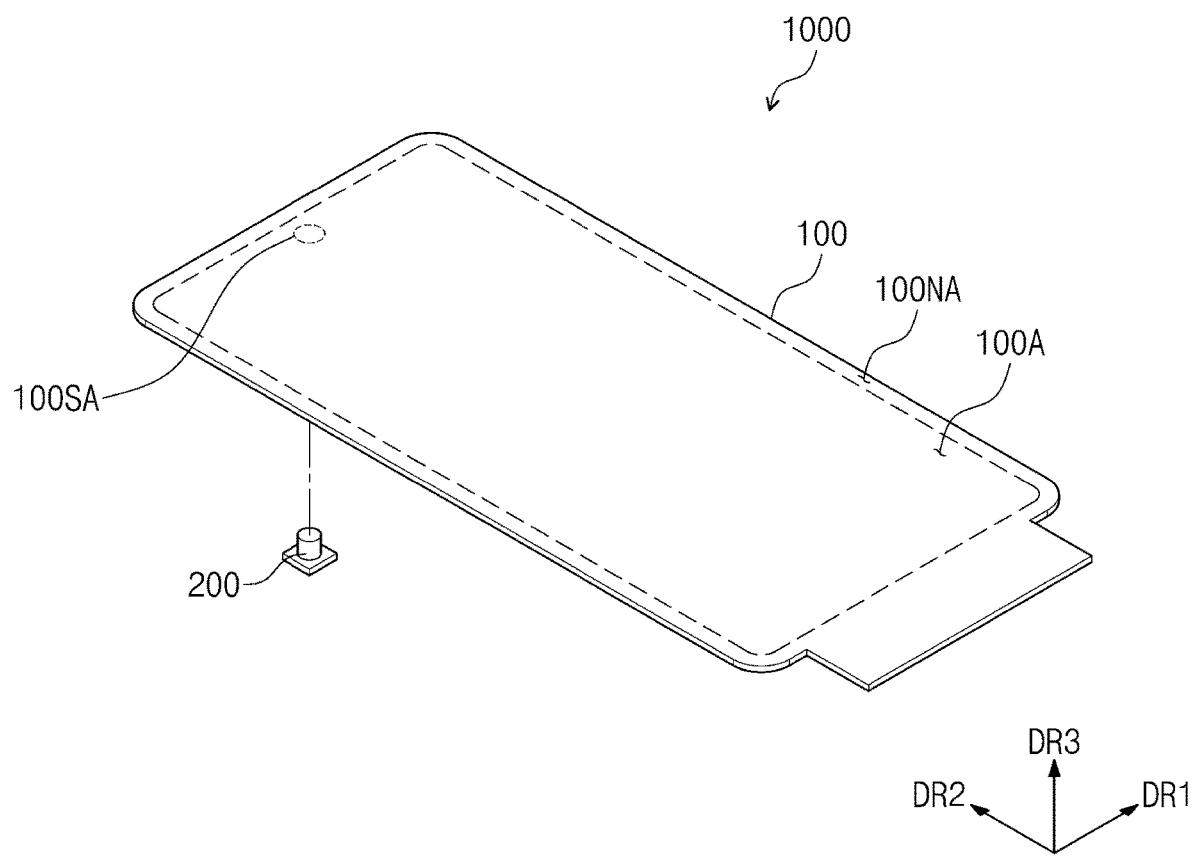
FIG. 2 is an exploded perspective view illustrating some components of the display device shown in FIG. 1.

FIG. 2 is an exploded perspective view illustrating some components of the display device shown in FIG. 1.

Referring to FIG. 2, the display device 1000 may include a display panel 100 and an electronic module 200. The display panel 100 may be a component that generates an image and detects an input applied from the outside. The electronic module 200 is disposed under the display panel 100 and may be, for example, a camera module.

The display panel 100 may have an active region 100A and a peripheral region 100NA. The active region 100A may correspond to the active region 1000A, and the peripheral region 100NA may correspond to the peripheral region 1000NA illustrated in FIG. 1.

The sensing region 100SA, which overlaps the electronic module 200, may be a portion of (e.g., may be in or surrounded along a periphery by) the active region 100A. For example, the sensing region 100SA may display an image and transmit an input received by the electronic module 200 and/or an output from the electronic module 200.

Figure 3A:
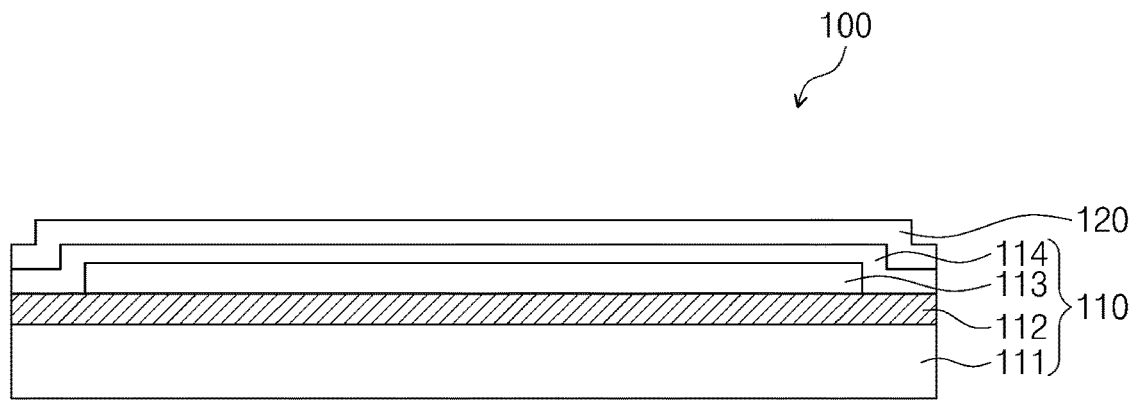
FIG. 3A is a cross-sectional view illustrating a display panel according to an embodiment of the present disclosure.
Figure 3A:
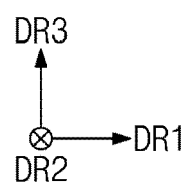

FIG. 3A is a cross-sectional view illustrating a display panel according to an embodiment of the present disclosure.

Referring to FIG. 3A, the display panel 100 may include a display layer 110 and a sensor layer 120.

The display layer 110 may be a component that substantially generates an image. The display layer 110 may be a light-emitting display layer, for example, an organic light-emitting display layer, a quantum dot display layer, or a micro LED display layer.

The display layer 110 may include a base layer 111, a circuit layer 112, a light-emitting element layer 113, and an encapsulation layer 114.

The base layer 111 may include a synthetic resin layer. The synthetic resin layer may include a thermosetting resin. The base layer 111 may have a multilayer structure. For example, the base layer 111 may have a three-layer structure of a synthetic resin layer, an adhesive layer, and a synthetic resin layer. For example, the synthetic resin layer may be a polyimide-based resin layer, but the material thereof is not particularly limited. The synthetic resin layer may include any one from among an acryl resin, a methacrylic resin, a polyisoprene vinyl resin, an epoxy resin, a urethane resin, a cellulose resin, a siloxane resin, a polyimide resin, or a methylene resin. In other embodiments, the base layer 111 may include a glass substrate, an organic/inorganic composite material substrate, or the like.

The circuit layer 112 may be disposed on the base layer 111. The circuit layer 112 may include an insulating layer, a semiconductor pattern, a conductive pattern, a signal line, and the like. An insulating layer, a semiconductor layer, and a conductive layer may be formed on the base layer 111 through a method, such as coating, deposition, or the like, and subsequently, the insulating layer, the semiconductor layer, and the conductive layer may be selectively patterned through a plurality of photolithographic processes. Subsequently, a semiconductor pattern, a conductive pattern, and a signal line, which are included in a circuit layer 112, may be formed.

The light-emitting element layer 113 may be disposed on the circuit layer 112. The light-emitting element layer 113 may include a light-emitting element. For example, the light-emitting element layer 113 may include an organic light-emitting material, quantum dots, quantum rods, or micro LEDs.

The encapsulation layer 114 may be disposed on the light-emitting element layer 113. The encapsulation layer 114 may include an inorganic layer, an organic layer, and an inorganic layer that are sequentially laminated, but the layers constituting the encapsulation layer 114 are not limited thereto.

When the encapsulation layer 114 has the sequentially laminated structure, the inorganic layer(s) may protect the light-emitting element layer 113 from water and oxygen, and the organic layer(s) may protect the light-emitting element layer 113 from foreign substances, such as dust particles. The inorganic layer(s) may include a silicon nitride layer, a silicon oxynitride layer, a silicon oxide layer, a titanium oxide layer, an aluminum oxide layer, or the like, and the organic layer(s) may include an acrylic organic layer. However, the present disclosure is not limited to these examples.

The sensor layer 120 may be disposed on the display layer 110. The sensor layer 120 may detect an external input applied from the outside. The external input may be an input of a user. User's input may mean various type external inputs such as a portion of the user, light, heat, a pen, or a pressure.

The sensor layer 120 may be disposed on the display layer 110 through a continuous process. In such an embodiment, the sensor layer 120 may be directly disposed on the display layer 110. As used herein, "directly disposed" indicates that a third component (e.g., a separate adhesive member) is not disposed between the sensor layer 120 and the display layer 110.

In another embodiment, the sensor layer 120 may be coupled to the display layer 110 through an adhesive member. The adhesive member may include a general adhesive or an adhesive agent.

Figure 3B:
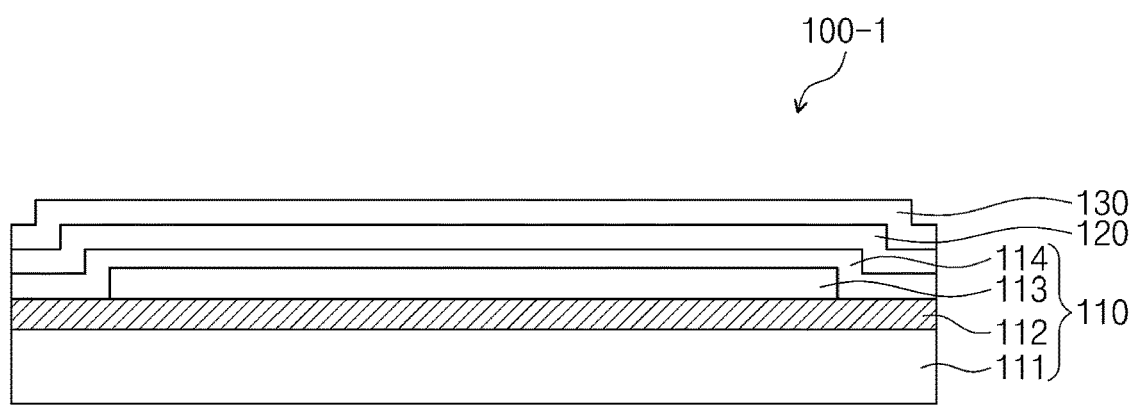
FIG. 3B is a cross-sectional view of a display panel according to an embodiment of the present disclosure.
Figure 3B:
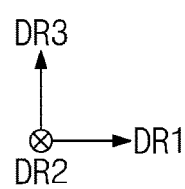

FIG. 3B is a cross-sectional view of a display panel according to an embodiment of the present disclosure.

Referring to FIG. 3B, a display panel 100-1 may further include an antireflective layer 130 when compared with the display panel 100 described with respect to FIG. 3A.

The antireflective layer 130 may reduce the reflectivity of external light incident on the display panel 100-1 from the outside.

The antireflective layer 130 may be disposed on the sensor layer 120. However, the position of the antireflective layer 130 is not limited thereto. For example, the antireflective layer 130 may be disposed between the sensor layer 120 and the display layer 110.

In one embodiment, the antireflective layer 130 may include color filters. The color filters may have (or may be arranged in) an array (e.g., a predetermined array). The array of the color filters may be determined considering light-emitting colors of the pixels included in the display layer 110. In addition, the antireflective layer 130 may further include a black matrix adjacent to the color filters.

In one embodiment, the antireflective layer 130 may include (or may have) a destructive interference structure. For example, the destructive interference structure may include a first reflective layer and a second reflective layer disposed on mutually different layers. A first reflective beam and a second reflective beam, which are respectively reflected from a first reflective layer and a second reflective layer, may be destructively interfered, and thus, the external light reflectivity may be decreased.

The antireflective layer 130 according to an exemplary embodiment may include a stretchable synthetic film. For example, the antireflective layer 130 may be provided by dyeing a polyvinyl alcohol film (PVA film) with an iodine compound.

Figure 4A:
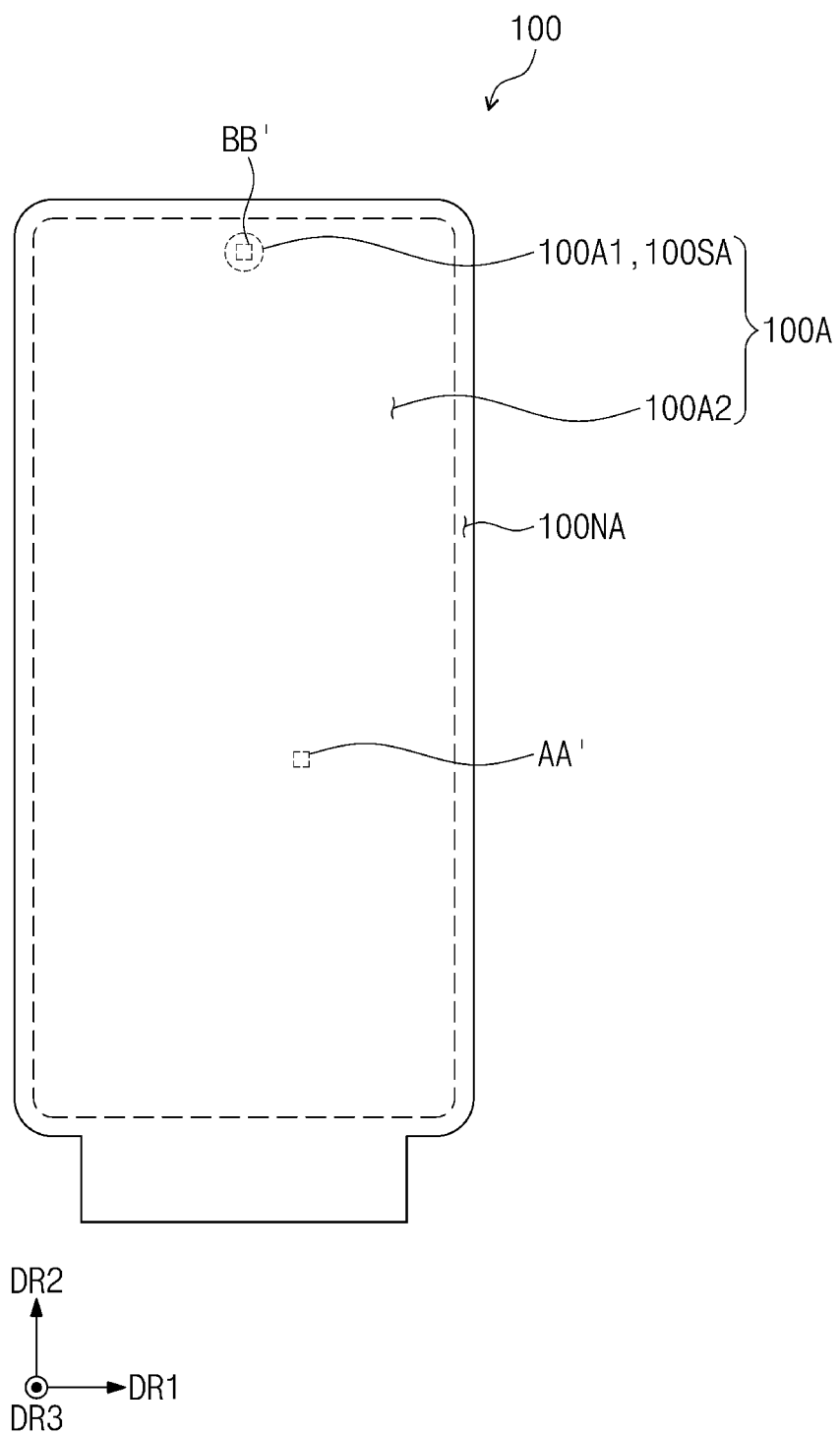
FIG. 4A is a plan view of a display panel according to an embodiment of the present disclosure.

FIG. 4A is a plan view of a display panel according to an embodiment of the present disclosure.

Referring to FIG. 4A, the active region 100A of the display panel 100 may have a first region 100A1 and a second region 100A2. The transmittance of the first region 100A1 and the second region 100A2 may be different from each other. For example, the transmittance of the first region 100A1 may be higher than the transmittance of the second region 100A2.

To ensure that the transmittance of the first region 100A1 is higher than the transmittance of the second region 100A2, some components may not be disposed in (e.g., may be omitted from) the first region 100A1. For example, fewer pixels may be disposed in the first region 100A1 than in the second region 100A2 per unit area, such that the resolution in the first region 100A1 may be lower than the resolution in the second region 100A2.

The first region 100A1 may correspond to a sensing region 100SA. In such an embodiment, the area of the first region 100A1 having a relatively low resolution may be minimized (e.g., may be relatively small or as small as is practicable).

Figure 4B:
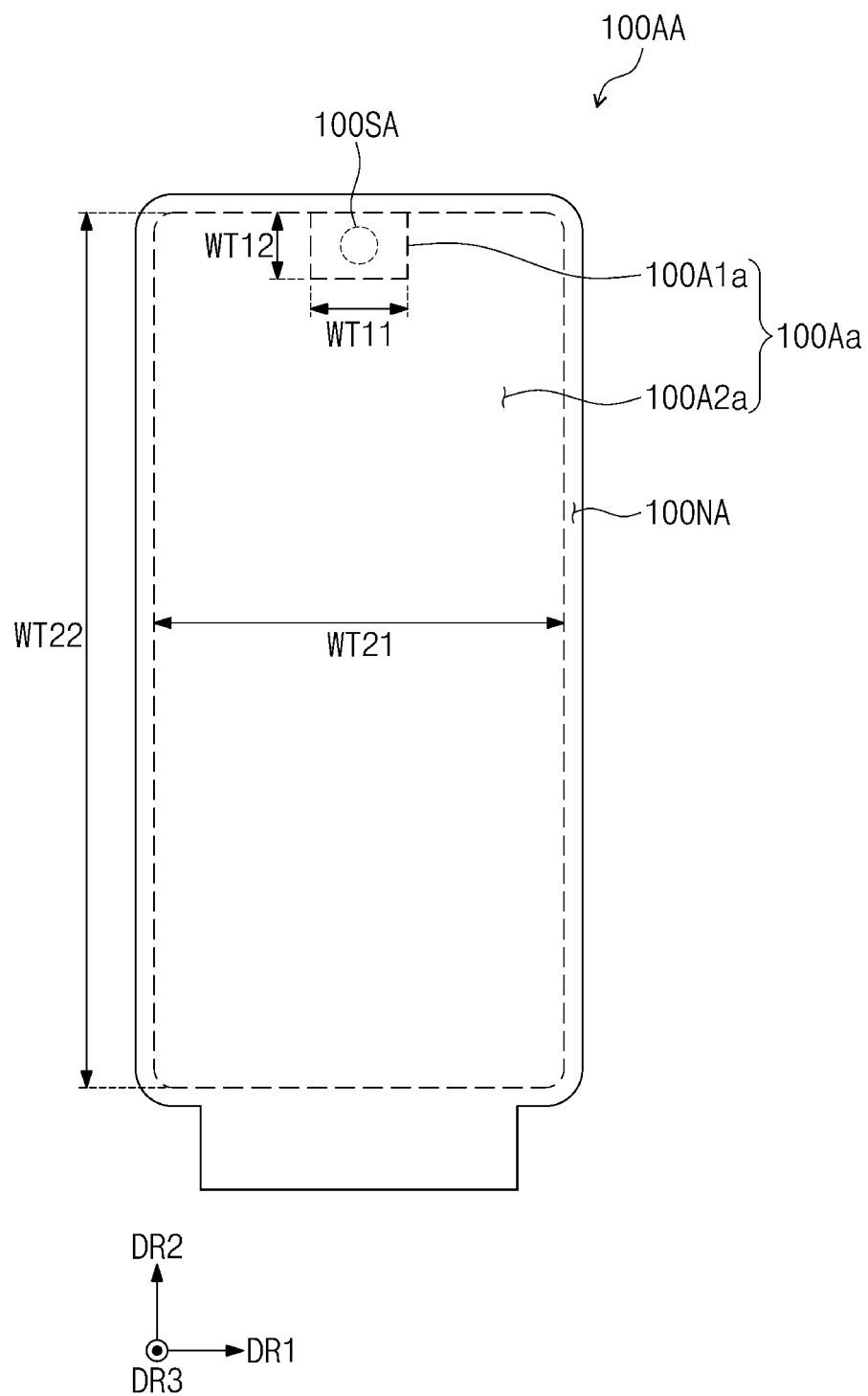
FIG. 4B is a plan view of a display panel according to an embodiment of the present disclosure.

FIG. 4B is a plan view of a display panel according to an embodiment of the present disclosure.

Referring to FIG. 4B, an active region 100Aa of a display panel 100AA may have a first region 100A1a and a second region 100A2a. The transmittance of the first region 100A1a may be higher than the transmittance of the second region 100A2*a*. In addition, the resolution in the first region 100A1*a* may be lower than the resolution in the second region 100A2*a*.

The area of the first region 100A1*a* may be larger than the area of a sensing region 100SA. For example, when an electronic module 200 is a camera module (see, e.g., FIG. 2), the sensing region 100SA may be defined as a region inside the viewing angle of the camera module. The first region 100A1*a* may include the sensing region 100SA and may include a portion of a peripheral region 100NA adjacent to the sensing region 100SA (e.g., the first region 100A1*a* may be larger than the sensing region 100SA).

The first region 100A1*a* may have a rectangular shape. At least three sides of the first region 100A1*a* may contact the second region 100A2*a*. However, the present disclosure is not limited thereto. For example, when an electronic module 200 is a camera module (see, e.g., FIG. 2), the first region 100A1*a* may be completely surrounded by the second region 100A2*a* (e.g., the second region 100A2*a* may extend entirely around a periphery of the first region 100A1*a*).

The maximum width WT11 of the first region 100A1*a* in the first direction DR1 may be smaller than the maximum width WT21 of the second region 100A2*a* in the first direction DR1. In addition, the maximum width WT12 of the first region 100A1*a* in the second direction DR2 may be smaller than the maximum width WT22 of the second region 100A2*a* in the second direction DR2. The maximum width WT21 of the second region 100A2*a* may be the maximum width of the active region 100Aa in the first direction DR1, and the maximum width WT22 of the second region 100A2*a* may be the maximum width of the active region 100Aa in the second direction DR2.

Figure 4C:
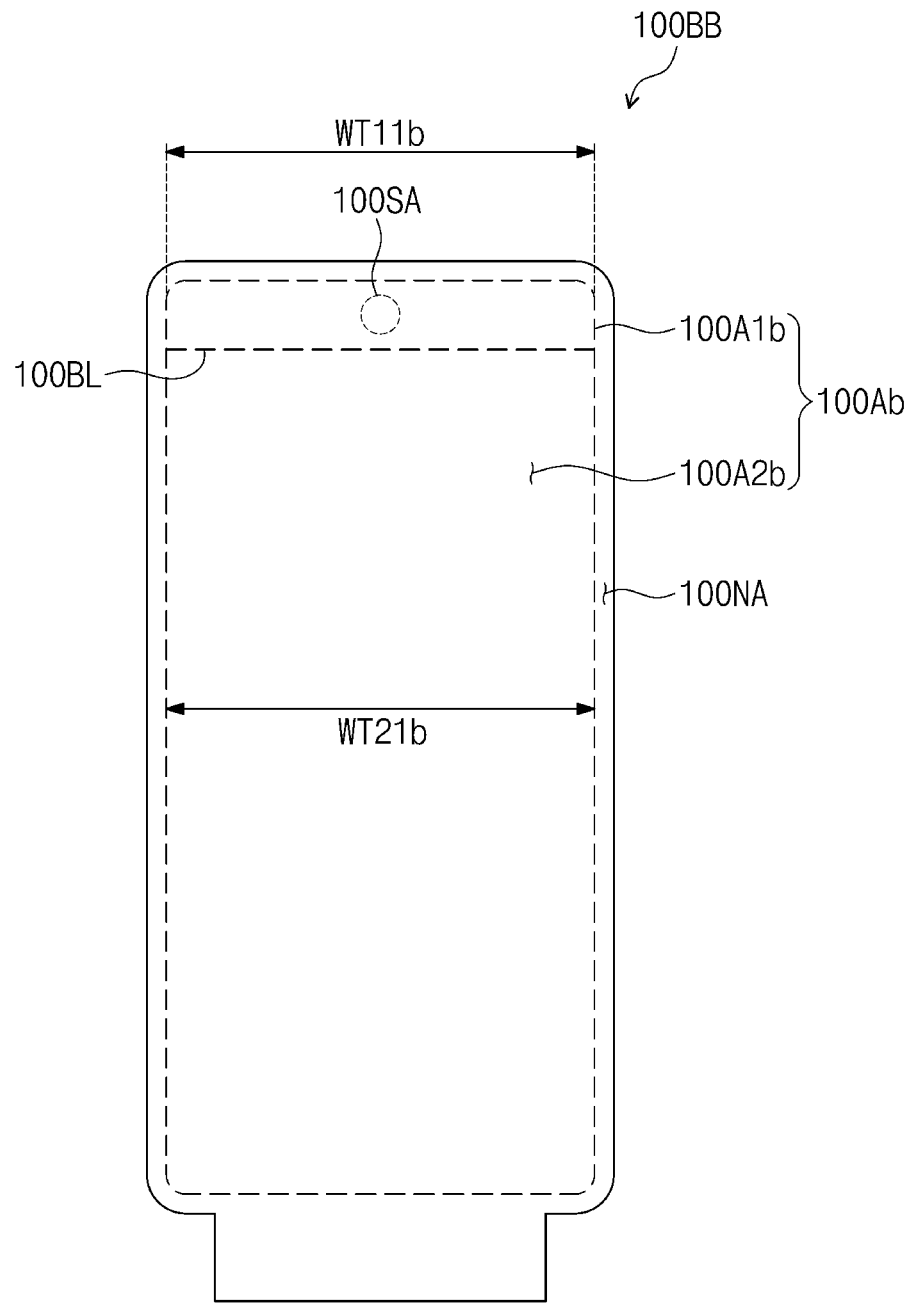
FIG. 4C is a plan view of a display panel according to an embodiment of the present disclosure.

FIG. 4C is a plan view of a display panel according to an embodiment of the present disclosure.

Referring to FIG. 4C, an active region 100Ab of a display panel 100BB may have a first region 100A1*b* and a second region 100A2*b*. The transmittance of the first region 100A1*b* may be higher than the transmittance of the second region 100A2*b*. In addition, the resolution of the first region 100A1*b* may be lower than the resolution of the second region 100A2*b*.

The area of the first region 100A1*b* may be larger than the area of a sensing region 100SA. A boundary 100BL between the first region 100A1*b* and the second region 100A2*b* may extend in the first direction DR1. The maximum width WT11*b* of the first region 100A1*b* in the first direction DR1 may be substantially the same as the maximum width WT21*b* of the second region 100A2*b* in the first direction DR1.

Figure 5:
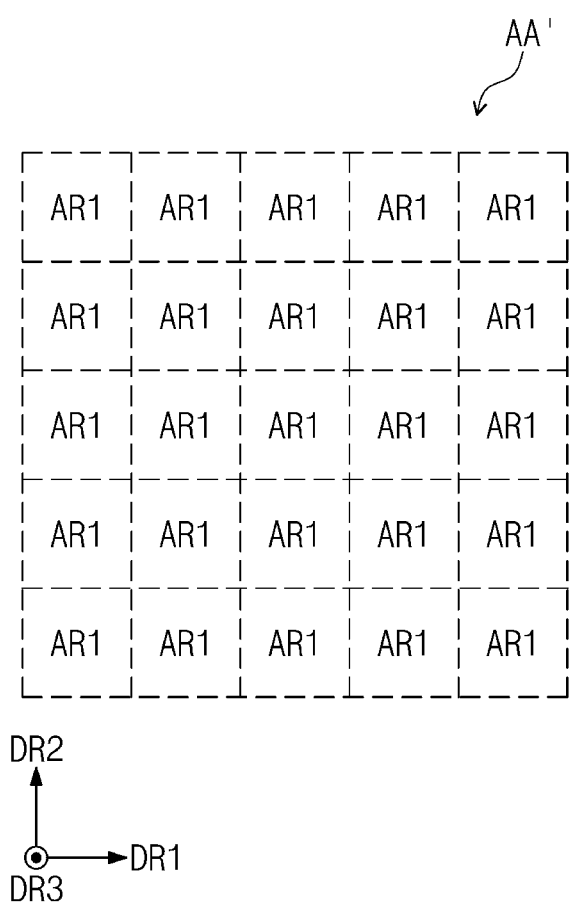
FIG. 5 is an expanded plan view illustrating the region AA' of FIG. 4A.

FIG. 5 is an expanded plan view illustrating the region AA' of FIG. 4A.

Referring to FIGS. 4A and 5, the second region 100A2 may be divided into a plurality of sub-regions AR1 (hereinafter referred to as "sub-regions"). At least one sub-pixel may be disposed on each of the sub-regions AR1. The sub-regions AR1 may be arrayed in the first direction DR1 and the second direction DR2.

Figure 6:
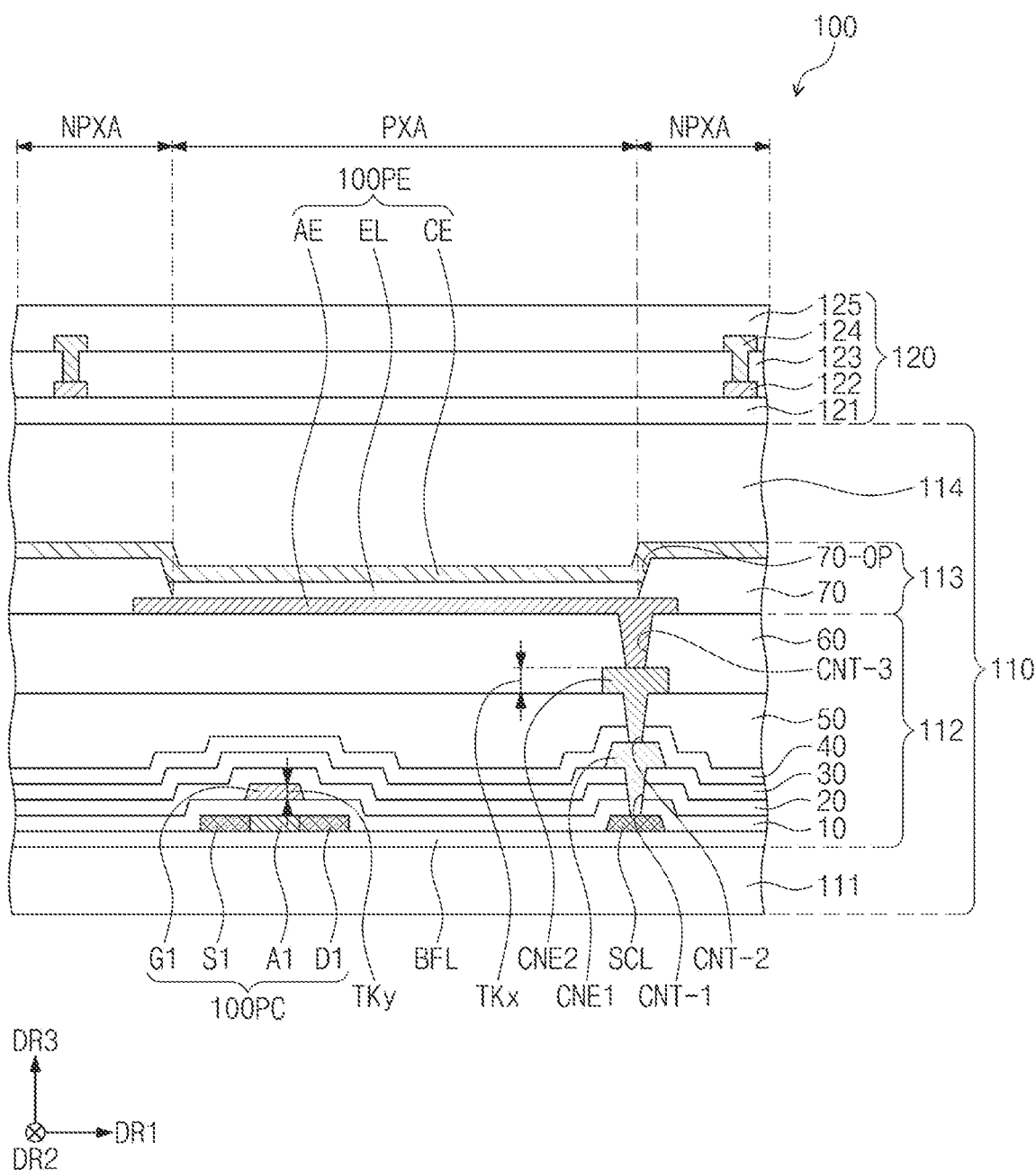
FIG. 6 is a cross-sectional view of a display panel according to an embodiment of the present disclosure.

FIG. 6 is a cross-sectional view of a display panel according to an embodiment of the present disclosure.

Referring to FIG. 6, a display layer 110 may include a plurality of insulating layers, a semiconductor pattern, a conductive pattern, signal lines, and the like. An insulating layer, a semiconductor layer, and a conductive layer are formed through a method, such as coating or deposition. Next, an insulating layer, a semiconductor layer, and a conductive layer may be selectively patterned by a photolithography method. Through such a method, a circuit layer 112 including a semiconductor pattern, a conductive pattern, a signal line, and the like, which are included in a light-emitting element layer 113, is formed. Next, an encapsulation layer 114 that covers the light-emitting element layer 113 may be formed.

An inorganic layer is formed on the upper surface of a base layer 111. The inorganic layer may include at least one from among aluminum oxide, titanium oxide, silicon oxide, silicon oxynitride, zirconium oxide, or hafnium oxide. The inorganic layer may include a plurality of layers (e.g., may have a multilayer structure). When the inorganic layer includes a plurality of layers, the inorganic layers may include a barrier layer and/or a buffer layer. In this embodiment, the display layer 110 is illustrated as including a buffer layer BFL.

The buffer layer BFL may improve the coupling capability between the base layer 111 and a semiconductor pattern. The buffer layer BFL may include a silicon oxide layer and a silicon nitride layer, and the silicon oxide layer and the silicon nitride layer may be alternately laminated.

The semiconductor pattern may be disposed on the buffer layer BFL. The semiconductor pattern may include polysilicon. However, the present disclosure is not limited thereto, and the semiconductor pattern may also include amorphous silicon or an oxide semiconductor.

FIG. 6 illustrates a portion of the semiconductor pattern, and a semiconductor pattern may be further disposed in another region. The semiconductor pattern may be disposed over the pixels, and the semiconductor pattern may have a shape having a specific rule. The semiconductor pattern may have different electrical properties according to whether or not it undergoes doping (e.g., whether or not it is doped). For example, the semiconductor pattern may include a doping region and a non-doping region. The doping region may be doped with an N-type dopant or a P-type dopant. A p-type transistor may include a doping region doped with a P-type dopant, and an N-type transistor may include a doping region doped with a N-type dopant.

The doping region has greater conductivity than the non-doping region and may function as an electrode or a signal line. The non-doping region may substantially correspond to the active region (or channel) of a transistor. For example, a portion of the semiconductor pattern may be the active region of a transistor, another portion of the semiconductor pattern may be the source or drain of the transistor, and yet another portion of the semiconductor pattern may be a connecting electrode or a connecting signal line.

In some embodiments, each of pixels may have an equivalent circuit including seven transistors, a capacitor (e.g., a single capacitor), and a light-emitting element, but pixels may have other suitable equivalent circuit designs. FIG. 6 exemplarily illustrates a transistor 100PC and light-emitting element 100PE, both of which are included in a pixel.

A source (e.g., a source electrode or source region) S1, an active region A1, and a drain (e.g., a drain electrode or drain region) D1 of the transistor 100PC may be formed as a semiconductor pattern. The source S1 and the drain D1 may extend in mutually opposing directions from the active region A1. FIG. 6 illustrates a portion of a connecting signal line SCL formed from the semiconductor pattern. The connecting signal line SCL may be connected to the drain D1 of the transistor 100PC on a plane.

A first insulating layer 10 may be disposed on the buffer layer BFL. The first insulating layer 10 may overlap a plurality of pixels in common (e.g., the first insulating layer 10 may extend through a plurality of pixels) and may cover the semiconductor pattern. The first insulating layer 10 may include an inorganic layer and/or an organic layer and may have a single-layer or a multi-layer structure. The first insulating layer 10 may include at least one from among aluminum oxide, titanium oxide, silicon oxide, silicon oxynitride, zirconium oxide, or hafnium oxide. In the illustrated embodiment, the first insulating layer 10 is a single-layer silicon oxide layer, but the present disclosure is not limited thereto. The circuit layer 112, described in more detail below, may include an inorganic layer and/or an organic layer and may have a single-layer or a multi-layer structure. The inorganic layer may include at least one from among the above-described materials, but the present disclosure is not limited thereto.

A gate (e.g., a gate electrode) G1 of the transistor 100PC is disposed on the first insulating layer 10. The gate G1 may be a portion of a metallic pattern. The gate G1 overlaps the active region A1. The gate G1 may be formed by a mask in the process of doping the semiconductor pattern.

A second insulating layer 20 is disposed on the first insulating layer 10 and may cover the gate G1. The second insulating layer 20 may overlap the pixels in common. The second insulating layer 20 may include an inorganic layer and/or an organic layer and may have a single-layer or a multi-layer structure. In the illustrated embodiment, the second insulating layer 20 is a single-layer silicon oxide layer, but the present disclosure is not limited thereto.

A third insulating layer 30 may be disposed on the second insulating layer 20, and in the illustrated embodiment, the third insulating layer 30 is a single-layer silicon oxide layer. The present disclosure, however, is not limited thereto.

A first connecting electrode CNE1 may be disposed on the third insulating layer 30. The first connecting electrode CNE1 may be connected to the connecting signal line SCL through a contact opening (e.g., a contact hole) CNT-1 passing through the first, second, and third insulating layers 10, 20, and 30.

A fourth insulating layer 40 may be disposed on the third insulating layer 30. The fourth insulating layer 40 may be an inorganic layer (e.g., a single-layer silicon oxide layer). A fifth insulating layer 50 may be disposed on the fourth insulating layer 40. The fifth insulating layer 50 may be an organic layer.

A second connecting electrode CNE2 may be disposed on the fifth insulating layer 50. The second connecting electrode CNE2 may be connected to the first connecting electrode CNE1 through a contact opening (e.g., a contact hole) CNT-2 passing through the fourth insulating layer 40 and the fifth insulating layer 50.

A first thickness TKx of the second connecting electrode CNE2 (e.g., a thickness of the second connecting electrode CNE2 above the fifth insulating layer 50) may be larger than a second thickness TKy of the gate G1. For example, the first thickness TKx may be about three times the second thickness TKy. The first thickness TKx may be about 6,000 angstroms, and the second thickness TKy may be about 2,000 angstroms. The first thickness TKx of the second connecting electrode CNE2 may be the same or substantially the same as a thickness of the first connecting electrode CNE1 (e.g., a thickness of the first connecting electrode CNE1 above the third insulating layer 30).

A sixth insulating layer 60 is disposed on the fifth insulating layer 50 and may cover the second connecting electrode CNE2. The sixth insulating layer 60 may be an organic layer.

The light-emitting element layer 113 including a light-emitting element 100PE may be disposed on the circuit layer 112. The light-emitting element 100PE may include a first electrode AE, an emission layer EL, and a second electrode CE.

The first electrode AE may be disposed on the sixth insulating layer 60. The first electrode AE may be connected to the second connecting electrode CNE2 through a contact opening (e.g., a contact hole) CNT-3 passing through the sixth insulating layer 60.

A pixel defining film 70 is disposed on the sixth insulating layer 60 and may not cover a portion of the first electrode AE (e.g., may cover only a portion or edge portion of the first electrode AE). An opening (e.g., an opening part) 70-OP may be defined in the pixel defining film 70. The opening 70-OP in the pixel defining film 70 exposes at least a portion of (e.g., a central portion of) the first electrode AE.

As illustrated in FIG. 6, the active region 100A (see, e.g., FIG. 2) may include a pixel region PXA and a non-pixel region NPXA adjacent to the pixel region PXA. The non-pixel region NPXA may surround (e.g., may extend around a periphery of) the pixel region PXA. In the illustrated embodiment, the pixel region PXA is defined as corresponding to the portion of the first electrode AE that is exposed by the opening 70-OP in the pixel defining film 70.

The emission layer EL may be disposed on the first electrode AE. The emission layer EL may be disposed in the region corresponding to the opening 70-OP in the pixel defining film 70. For example, the emission layer EL may be formed so as to be distributed to each of the pixels (e.g., a separate or individual emission layer EL may be formed in each pixel). When the emission layer EL is distributed to each of the pixels, each of the emission layers EL may emit light having at least one color from among blue, red, and green colors. However, the present disclosure is not limited thereto, and the emission layer EL may be connected to the pixels and also provided in common (e.g., a single emission layer EL may extend over a plurality or all of the pixels). In such an embodiment, the emission layer EL may provide a blue light or a white light.

The second electrode CE may be disposed on the emission layer EL. The second electrode CE may have an integrated shape and disposed to the plurality of pixels in common (e.g., the second electrode CE may be commonly disposed over a plurality or all of the pixels).

A hole control layer may be disposed between the first electrode AE and the emission layer EL. The hole control layer may be disposed in the pixel region PXA and the non-pixel region NPXA. The hole control layer may include a hole transportation layer and may further include a hole injection layer. An electron control layer may be disposed between the emission layer EL and the second electrode CE. The electron control layer may include an electron transportation layer and may further include an electron injection layer. The hole control layer and the electron control layer may be formed on the plurality of pixels using an open mask.

The encapsulation layer 114 may be disposed on the light-emitting element layer 113. The encapsulation layer 114 may protect the light-emitting element layer 113 from foreign substances, such as water, oxygen, or dust particles.

The sensor layer 120 may include a base insulating layer 121, a first conductive layer 122, a detection insulating layer 123, a second conductive layer 124, and a cover insulating layer 125.

The base insulating layer 121 may be an inorganic layer including any one from among silicon nitride, a silicon oxynitride, or silicon oxide. In other embodiments, the base insulating layer 121 may be an organic layer including an epoxy resin, an acrylic resin, or an imide resin. The base insulating layer 121 may have a single-layer structure or a multi-layer structure laminated in (e.g., stacked in) the third direction DR3.

Each of the first conductive layer 122 and the second conductive layer 124 may have a single-layer structure or a multi-layer structure laminated in the third direction DR3.

The single-layer conductive layer 122, 124 may include a metallic layer or a transparent conductive layer. The metallic layer may include molybdenum, titanium, copper, aluminum, or an alloy thereof. The transparent conductive layer may include a transparent conductive oxide, such as indium tin oxide (ITO), indium zinc oxide (IZO), zinc oxide (ZnO), or indium zinc tin oxide (IZTO). The transparent conductive layer may also include a conductive polymer, such as PEDOT, a metal nanowire, or graphene.

The multi-layer conductive layer 122, 124 may include metallic layers. The metallic layers may have, for example, a three-layer structure including titanium/aluminum/titanium. The multi-layer conductive layer 122, 124 may include a metallic layer and a transparent conductive layer.

The sensor layer 120 may acquire information about (or from) an external input through a change in mutual electrostatic capacitance and/or may acquire information about (or from) an external input through a change in self electrostatic capacitance. For example, the sensor layer 120 may include detecting patterns and bridge patterns. At least a portion from among the detecting patterns and the bridge patterns may be included in the first conductive layer 122 and at least a portion from among the detecting patterns and the bridge patterns may be included in the second conductive layer 124. The detection insulating layer 123 and/or the cover insulating layer 125 may include an inorganic layer. The inorganic layer may include at least one from among aluminum oxide, titanium oxide, silicon oxide, silicon oxynitride, zirconium oxide, or hafnium oxide.

The detection insulating layer 123 and/or the cover insulating layer 125 may include an organic layer. The organic layer may include any one from among an acryl resin, a methacrylic resin, a polyisoprene vinyl resin, an epoxy resin, a urethane resin, a cellulose resin, a siloxane resin, a polyimide resin, or a methylene resin.

Figure 7:
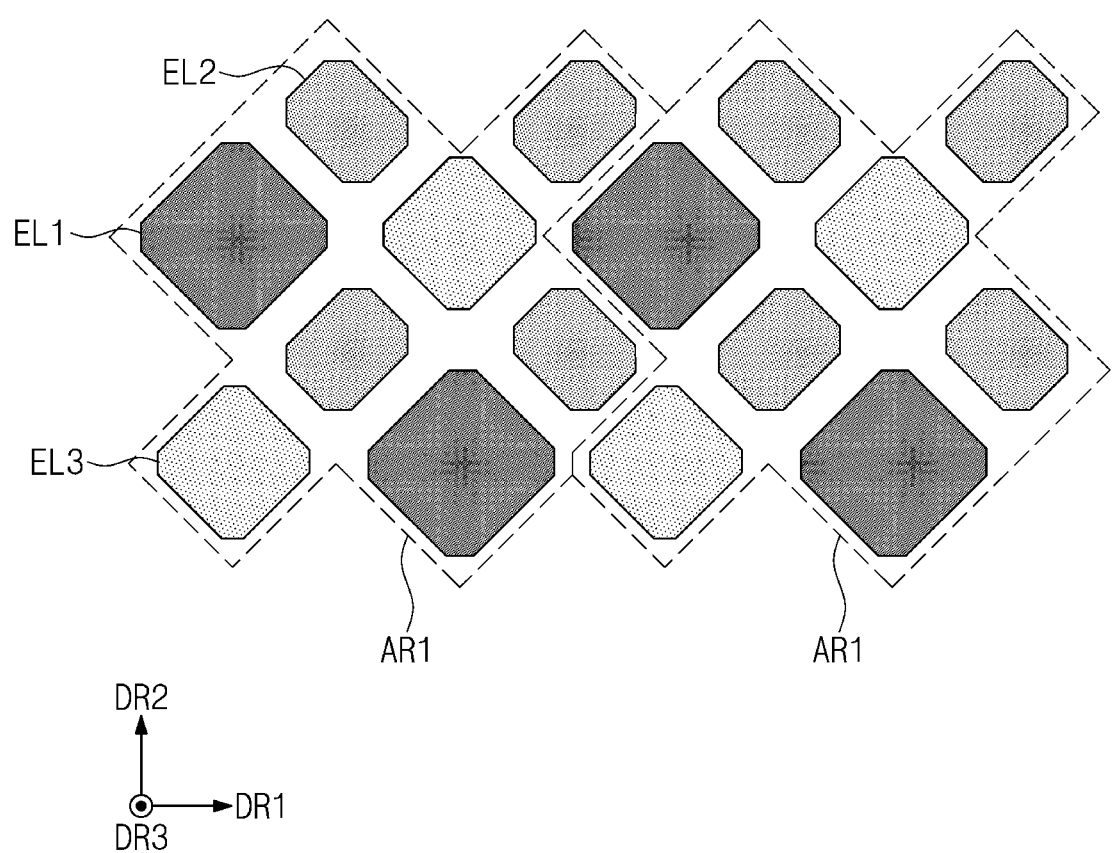
FIG. 7 is a plan view of some components of a display panel according to an embodiment of the present disclosure.

FIG. 7 is a plan view illustrating some components of a display panel according to an embodiment of the present disclosure. FIG. 7 illustrates two sub-regions AR1 and emission layers EL1, EL2, and EL3 disposed in the two sub-regions AR1.

Referring to FIGS. 5 to 7, eight emission layers EL1, EL2, and EL3 may be disposed in each of the sub-regions AR1. For example, two first emission layers EL1, four second emission layers EL2, and two third emission layers EL3 may be disposed in a single sub-region AR1. For example, the first emission layers EL1 may be emission layers that emit blue light, the second emission layers EL2 may be emission layers that emit green light, and the third emission layers EL3 may be emission layers that emit red light.

The area of each of the first emission layers EL1 may be larger than the area of each of the second emission layers EL2 and the area of each of the third emission layers EL3, and the area of each of the second emission layers EL2 may be smaller than the area of each of the third emission layers EL3.

The first emission layers EL1 and the third emission layers EL3 may be alternately arranged one by one along each of the first direction DR1 and the second direction DR2. The second emission layers EL2 may be arranged in the first direction DR1 and the second direction DR2. One second emission layer EL2 may be disposed between two first emission layers EL1 most adjacent to each other or between two third emission layers EL3 adjacent each other. The two first emission layers EL1 adjacent to each other may be spaced apart from each other in a direction between the first direction DR1 and the second direction DR2 (e.g., in a direction about 45° offset from both of the first direction DR1 and the second direction DR2). The arrangement form of the first to third emission layers EL1, EL2, and EL3 may be referred to as a PenTile structure.

The number of emission layers EL1, EL2, and EL3 which are disposed in the respective sub-regions AR1, the shapes of the emission layers EL1, EL2, and EL3, and the arrangement form of the emission layers EL1, EL2, and EL3 are not limited to the example illustrated in FIG. 7. The number of the emission layers EL1, EL2, and EL3 may be greater than or less than that in the illustrated example. The shapes of the emission layers EL1, EL2, and EL3 may be variously modified into rectangles, polygons, or circles, which are not diamond shapes or structures. The arrangement form of the emission layers EL1, EL2, and EL3 may be a stripe structure, which is not a PenTile structure.

FIGS. 8A to 8G are expanded plan views illustrating the region BB' of FIG. 4A. That is, FIGS. 8A to 8G are expanded plan views illustrating a region of the first region 100A1 shown in FIG. 4A.

The first region 100A1 may include first sub-regions AR1' and second sub-regions AR2. Each of the first sub-regions AR1' and the second sub-regions AR2 may be provided in plurality. The first sub-regions AR1' and the second sub-regions AR2 may be arranged while according to a rule or pattern (e.g., a predetermined rule or pattern).

Pixels may be disposed in the first sub-regions AR1', and the first sub-regions AR1' may be regions at where an image is provided. Thus, each of the first sub-regions AR1' may be referred to as an effective region.

The light transmittance in the second sub-regions AR2 may be higher than the light transmittance in the first sub-regions AR1'. The second sub-regions AR2 may each be referred to as a transmissive region, a non-display region, a semi-transmissive region, an opening region, or an open region.

Pixels may not be disposed in the second sub-regions AR2. Thus, the resolution of the first region 100A1 including the first sub-regions AR1' and the second sub-regions AR2 may be lower than the resolution of the second region 100A2 (see, e.g., FIG. 4A).

FIGS. 8A to 8G exemplarily illustrate arrangement relationships between the first sub-regions AR1' and the second sub-regions AR2. However, the present disclosure is not limited thereto. When the first region 100A1 includes both the first sub-regions AR1' and the second sub-regions AR2, the arrangement relationship of the first sub-regions AR1' and the second sub-regions AR2 may be variously changed.

Figure 8A:
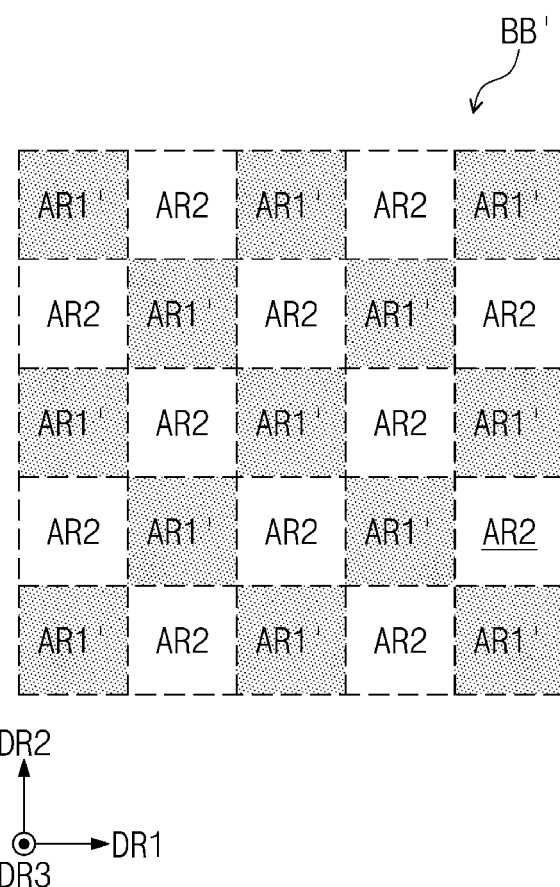
FIGS. 8A to 8G are expanded plan views illustrating the region BB' of FIG. 4A.

Referring to FIG. 8A, the first sub-regions AR1' and the second sub-regions AR2 may alternately be arranged in the first direction DR1 and the second direction DR2. For example, a single first sub-region AR1' and a single second sub-region AR2 may alternately be arranged.

Figure 8B:
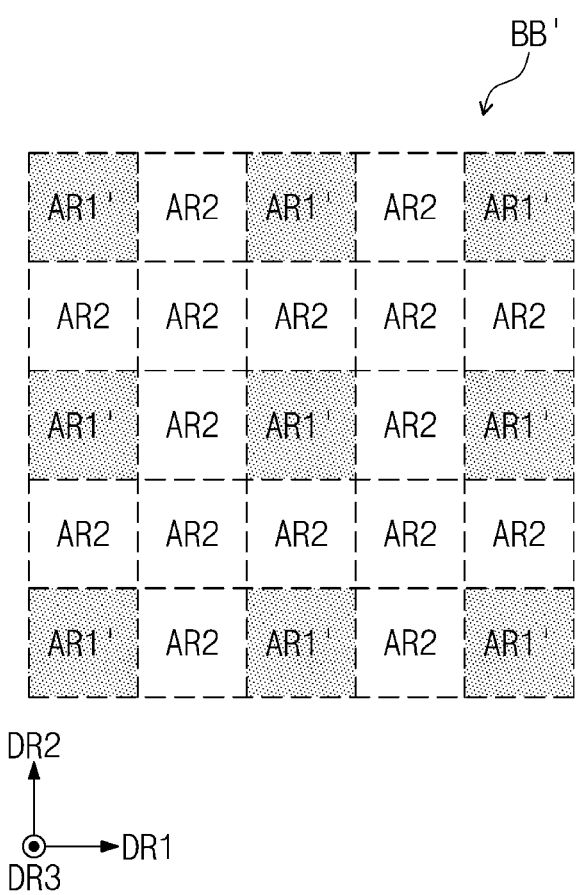

Referring to FIG. 8B, the first sub-regions AR1' may each be surrounded by the second sub-regions AR2 (e.g., each first sub-region AR1' may be surrounded along a periphery by second sub-regions AR2). For example, a first row of sub-regions and a second row of sub-regions may alternately be arranged in the second direction DR2. The first row of sub-regions may be a row in which a single first sub-region AR1' and a single second sub-region AR2 are arranged in (e.g., are alternately arranged in) the first direction DR1. The second row of sub-regions may be a row in which the second sub-regions AR2 are arranged in the first direction DR1 (e.g., the second row of sub-regions may only include the second sub-regions AR2).

Because the number of the second sub-regions AR2 per unit area is greater in FIG. 8B than in FIG. 8A, the resolution in FIG. 8B may be lower than that in FIG. 8A, and the transmittance in FIG. 8B may be higher than that in FIG. 8A.

Figure 8C:
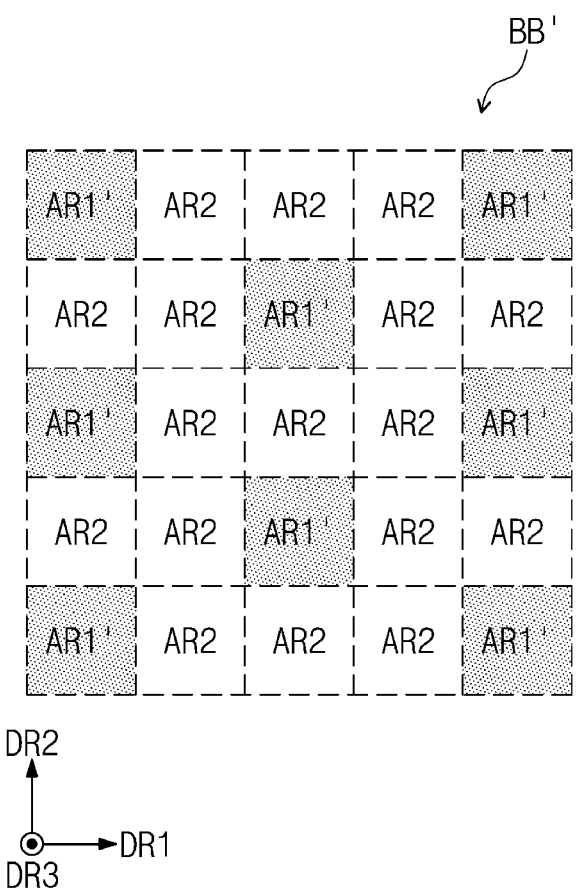

Referring to FIG. 8C, the first sub-regions AR1' may each be surrounded (e.g., surrounded along a periphery) by the second sub-regions AR2. For example, the first column, the second column, and the third column may be alternately arranged in (e.g., adjacent to each other in) the first direction DR1. The first column may be a column in which a single first sub-region AR1' and a single second sub-region AR2 are arranged in (e.g., are alternately arranged in) the second direction DR2. The second column may be a column in which the second sub-regions AR2 are arranged in the second direction DR2 (e.g., the second column may include only the second sub-regions AR2). The third column may be a column in which a single first sub-region AR1' and a single second sub-region AR2 are alternately arranged in the second direction DR2. When the even-numbered sub-regions in the first column are second sub-regions AR2, the even-numbered sub-regions in the third column may be first sub-regions AR1'.

Figure 8D:
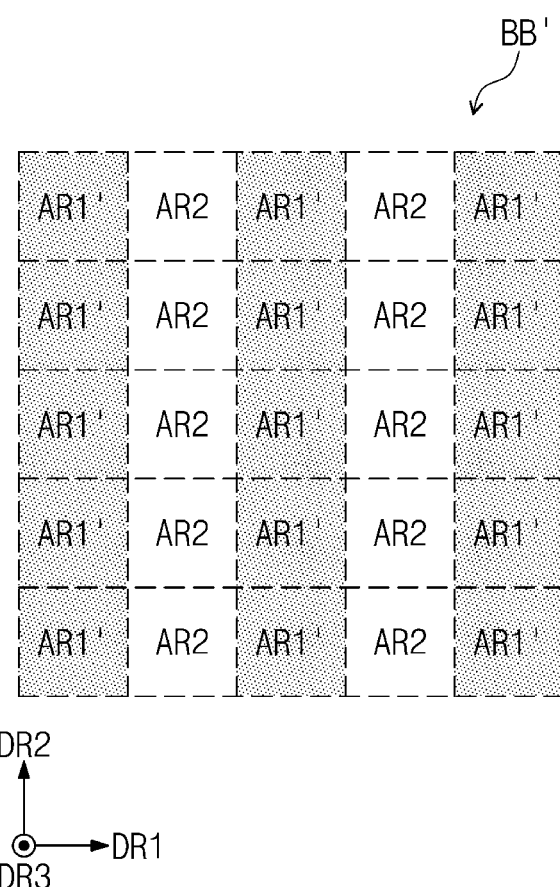

Referring to FIG. 8D, the first column and the second column may be alternately arranged in (e.g., adjacent to each other in) the first direction DR1. The first column may be a column in which the first sub-regions AR1' are arranged in the second direction DR2 (e.g., the first column may include only the first sub-regions AR1'). The second column may be a column in which the second sub-regions AR2 are arranged in the second direction DR2 (e.g., the second column may include only the second sub-regions AR2).

Figure 8E:
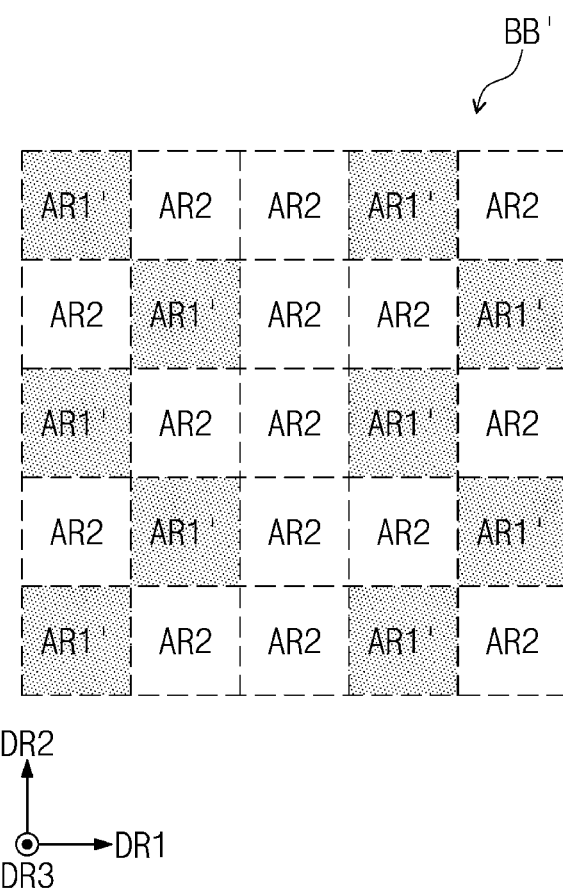

Referring to FIG. 8E, the first column, the second column, and the third column may be alternately arranged in (e.g., adjacent to each other in) the first direction DR1. The first column and the second column may each be a column in which a single first sub-region AR1' and a single second sub-region AR2 are arranged in (e.g., are alternately arranged in) the second direction DR2. The third column may be a column in which the second sub-regions AR2 are arranged in the second direction DR2 (e.g., the third column may include only the second sub-regions AR2). When the even-number sub-regions in the first column are second sub-regions AR2, the even-number sub-regions in the second column may be first sub-regions AR1'.

Figure 8F:
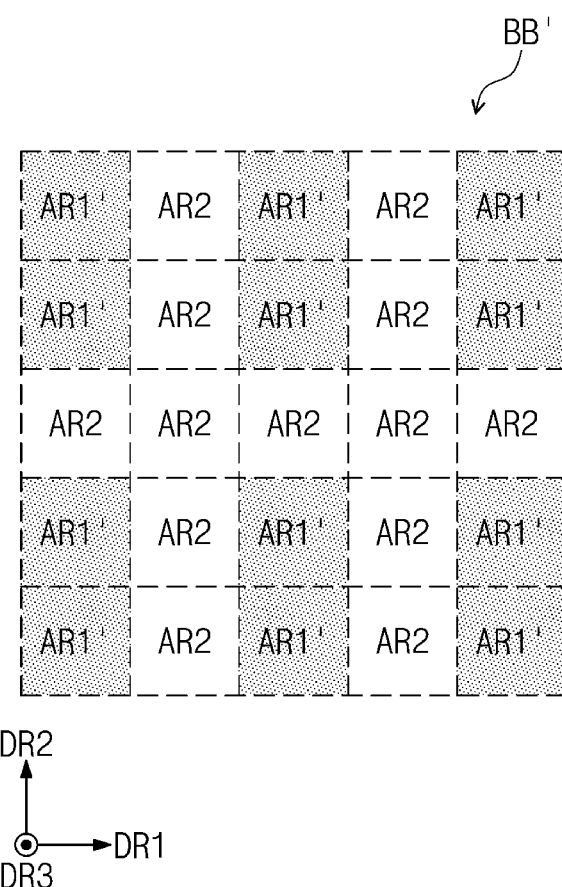

Referring to FIG. 8F, two first rows and a second row may alternately be arranged in the second direction DR2. The two first rows may each be a row in which a single first sub-region AR1' and a single second sub-region AR2 are arranged in (e.g., are alternately arranged in) the first direction DR1. The second row may be a row in which the second sub-regions AR2 (e.g., only the second sub-regions AR2) are arranged in the first direction DR1.

Figure 8G:
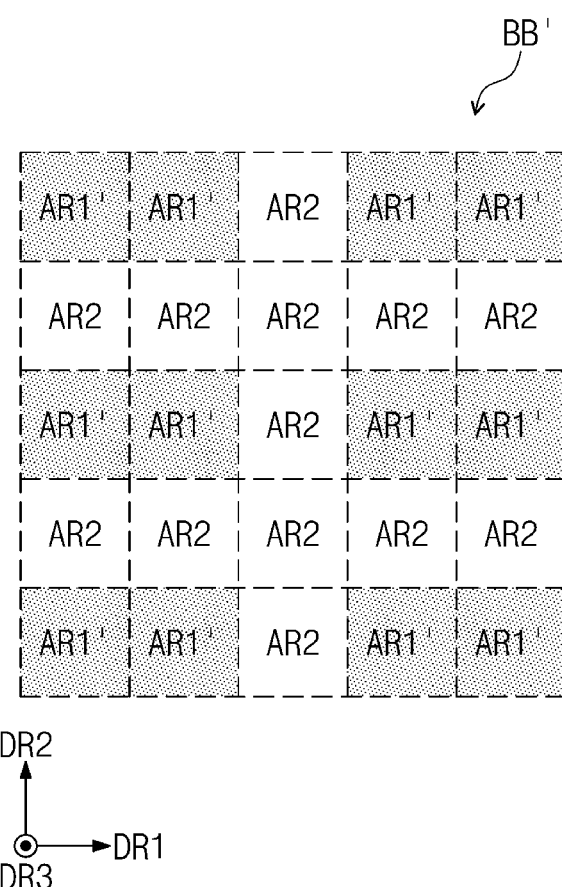

Referring to FIG. 8G, two first columns and a second column may be alternately arranged in the first direction DR1. The two first columns may each be a column in which a single first sub-region AR1' and a single second sub-region AR2 are arranged in (e.g., are alternately arranged in) the second direction DR2. The second column may be a column in which the second sub-regions AR2 are arranged in the second direction DR2 (e.g., the second columns may include only the second sub-regions AR2).

Figure 9:
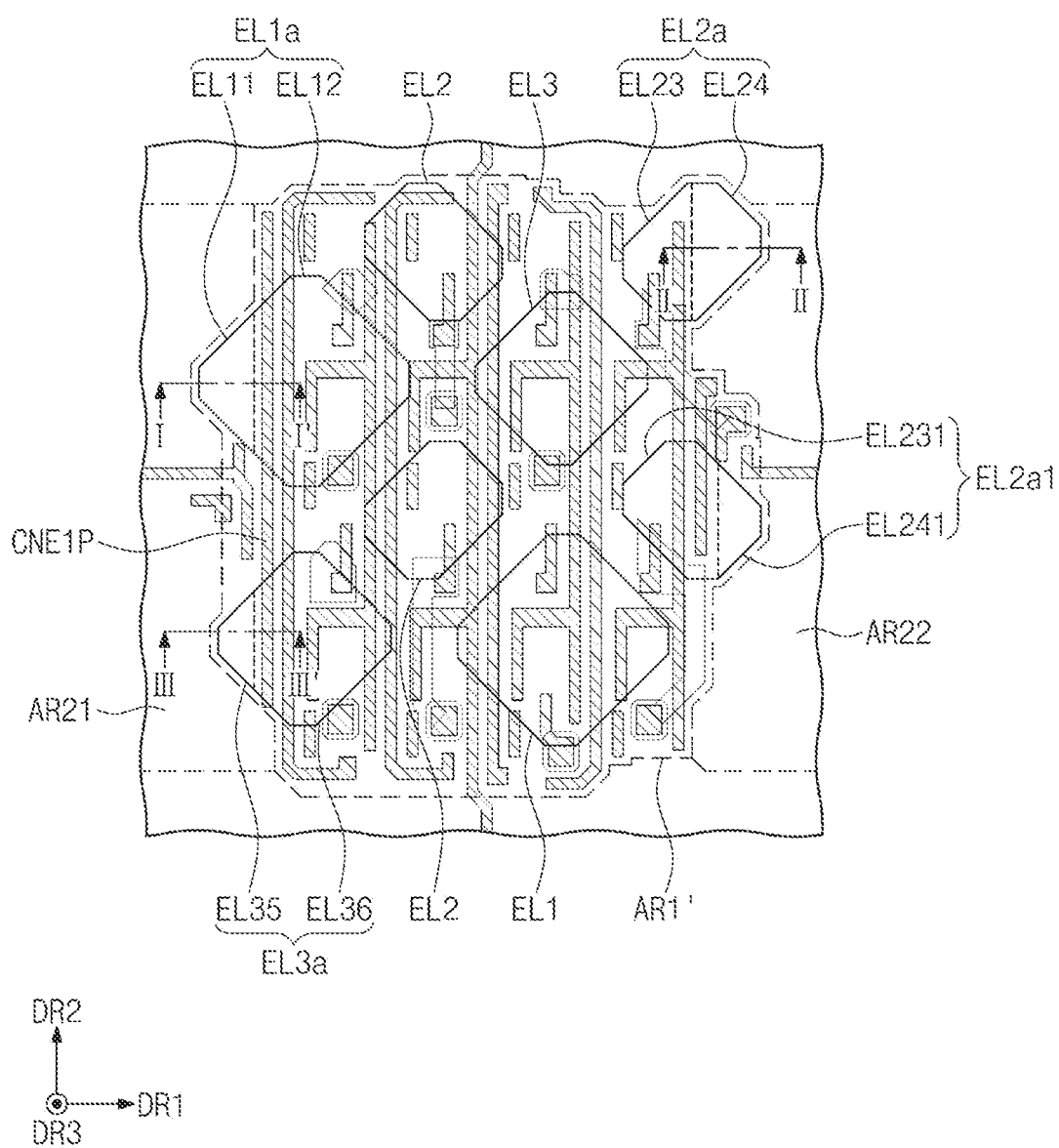
FIG. 9 is a plan view illustrating some components of a display panel according to an embodiment of the present disclosure.

FIG. 9 is a plan view illustrating some components of a display panel according to an embodiment of the present disclosure.

Referring to FIG. 9, a first sub-region AR1', a portion of a second sub-region AR21, and a portion of another second sub-region AR22 are illustrated. The second sub-region AR21 and the second sub-region AR22 may be spaced apart from each other with the first sub-region AR1' interposed therebetween. The second sub-region AR21 and the second sub-region AR22 may be spaced apart from each other in the first direction DR1.

Emission layers EL1, EL1a, EL2, EL2a, EL2a1, EL3, and EL3a may be disposed in the first sub-region AR1'. The first emission layers EL1 and EL1a may be emission layers that emit blue light, the second emission layers EL2, EL2a, and EL2a1 may be emission layers that emit green light, and the third emission layers EL3 and EL3a may be emission layers that emit red light.

Portions of the first emission layers EL1 and EL1a, the second emission layers EL2, EL2a and EL2a1, and the third emission layers EL3 and EL3a may be disposed adjacent to the second sub-region AR21 or the second sub-region AR22. FIG. 9 separately illustrates the reference symbols of the emission layers EL1a, EL2a, EL2a1 and EL3a which are disposed adjacent to the second sub-region AR21 or the second sub-region AR22.

The first emission layer EL1a may include a first light-emitting portion EL11 and a second light-emitting portion EL12. The second emission layer EL2a may include a third light-emitting portion EL23 and a fourth light-emitting portion EL24. The second emission layer EL2a1 may include a third light-emitting portion EL231 and a fourth light-emitting portion EL241. The third emission layer EL3a may include a fifth light-emitting portion EL35 and a sixth light-emitting portion EL36.

Pixels may not be disposed in the second sub-regions AR21 and AR22. In the first sub-region AR1', wires may not be disposed in some regions adjacent to the second sub-regions AR21 and AR22.

FIG. 9 illustrates patterns CNE1P disposed on the same layer as the first connecting electrode CNE1 (see, e.g., FIG. 6). The patterns CNE1P may each be a conductive pattern forming a portion of a scan line, a data line, or a light-emitting control line. The patterns CNE1P may not be disposed on some regions adjacent to the second sub-regions AR21 and AR22.

The first, second, and third emission layers EL1a, EL2a, EL2a1, and EL3a may include some portions that do not overlap (e.g., may not entirely overlap) the patterns CNE1P. For example, the first light-emitting portion EL11, the fourth light-emitting portion EL24, the fourth light-emitting portion EL241, and the fifth light-emitting portion EL35 may not overlap the patterns CNE1P.

According to an embodiment of the present disclosure, a white angle difference (WAD) characteristic may be improved by adjusting the thickness of the layers disposed under the first light-emitting portion EL11, the fourth light-emitting portion EL24, the fourth light-emitting portion EL241, and the fifth light-emitting portion EL35. WAD is a method to evaluate a change in the white angle difference according a viewing angle. For example, the WAD characteristic may be evaluated by measuring the change in the amount of brightness according to viewing angles and the change in the amount of color coordinate observed in a direction perpendicular to a screen, for example, the third direction DR3. When the WAD characteristic is improved, the display quality of the display device 1000 (see, e.g., FIG. 1) may be improved.

Figure 10A:
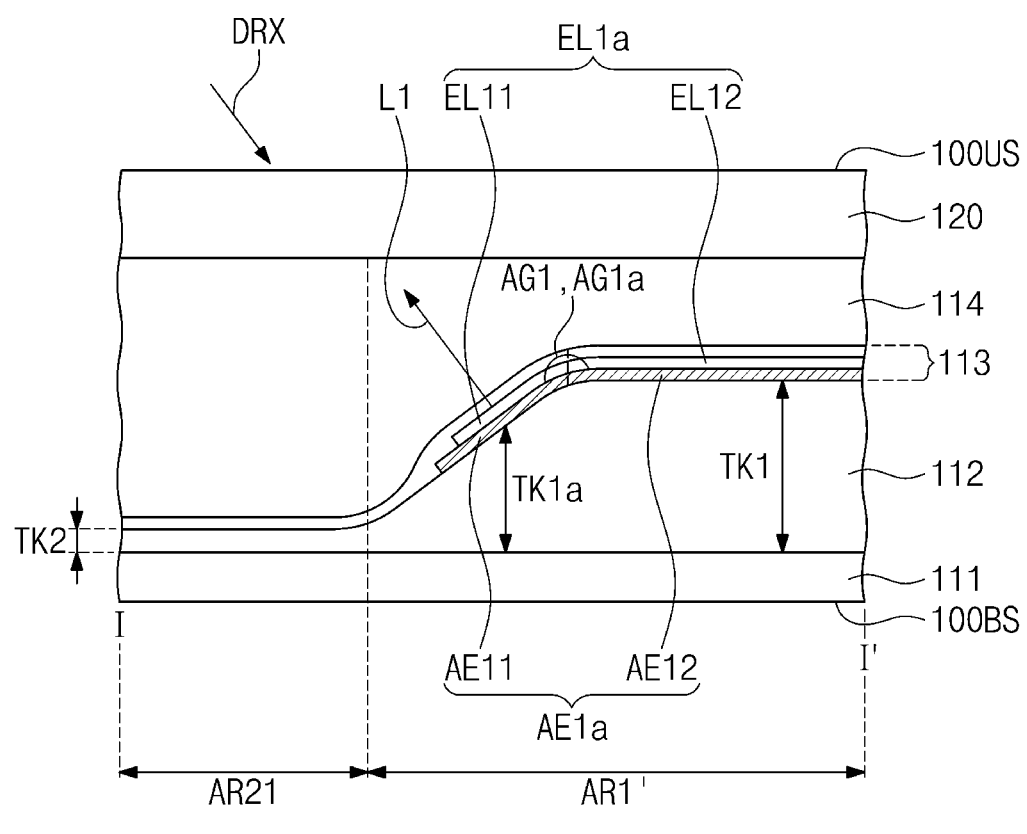
FIG. 10A is a cross-sectional view taken along the line I-I' in FIG. 9 according to an embodiment of the present disclosure.
Figure 10B:
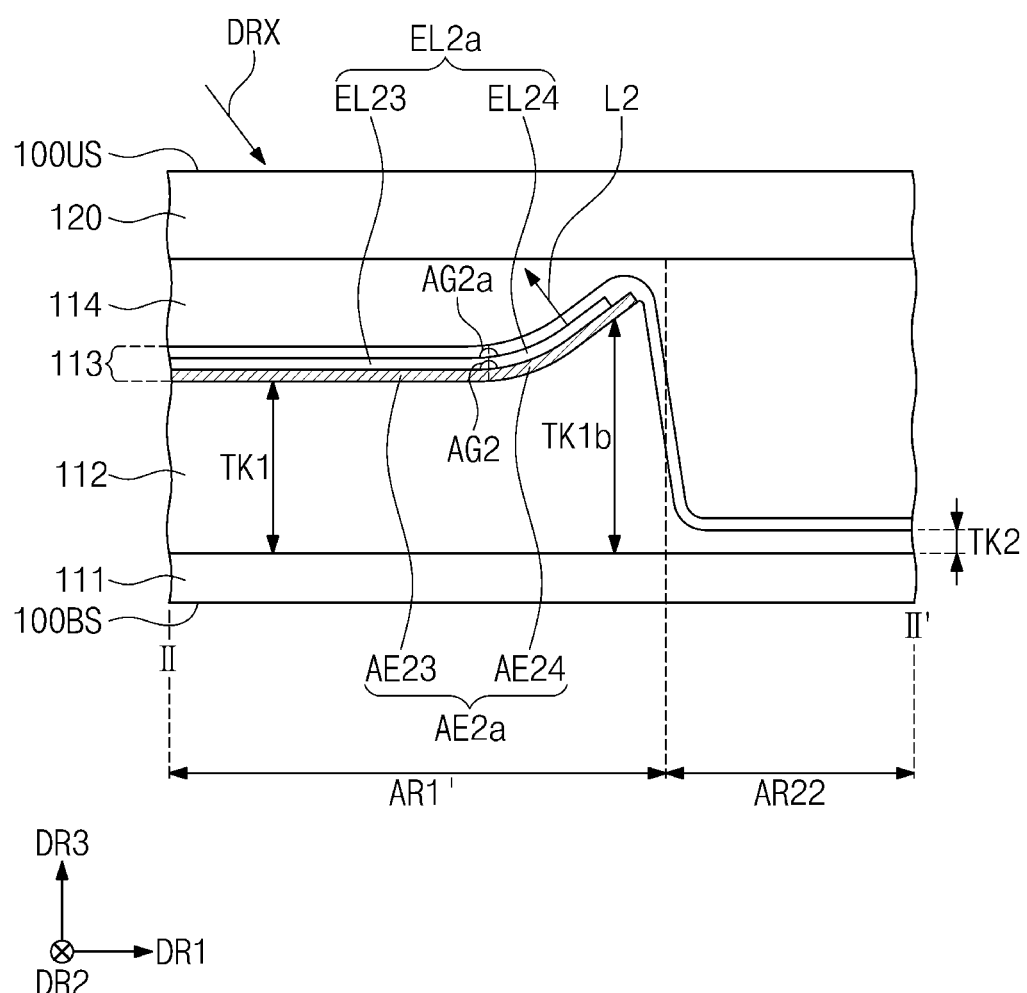
FIG. 10B is a cross-sectional view taken along the line II-II' in FIG. 9 according to an embodiment of the present disclosure.

FIG. 10A is a cross-sectional view taken along the I-I' in FIG. 9 according to an embodiment of the present disclosure, and FIG. 10B is a cross-sectional view taken along the II-II' in FIG. 9 according to an embodiment of the present disclosure.

Referring to FIG. 10A, the first emission layer EL1a and a first electrode AE1a disposed under the first emission layer EL1a are illustrated. Referring to FIG. 10B, the second emission layer EL2a and a first electrode AE2a (hereinafter, the "second first electrode") disposed under the second emission layer EL2a.

Referring to FIGS. 10A and 10B, the thickness of a circuit layer 112 may vary according to positions (e.g., may vary along the first direction DR1 and/or the second direction DR2). The thickness of the circuit layer 112 may correspond to the distance from the upper surface of the base layer 111 to the upper surface of the circuit layer 112, and the distance may be measured in a direction parallel to the third direction DR3.

The circuit layer 112 may have a first thickness TK1 within the first sub-region AR1' and may have a second thickness TK2 within the second sub-regions AR21 and AR22. At least a portion from among the layers constituting the circuit layer 112 may be omitted in the second sub-regions AR21 and AR22, and accordingly, the transmittance of the second sub-regions AR21 and AR22 may be higher than the transmittance of the first sub-region AR1'.

The thicknesses TK1a and TK1b of the circuit layer 112 at a portion of the first sub-region AR1' adjacent to the second sub-regions AR21 and AR22 may gradually decrease or gradually increases toward the second sub-regions AR21 and AR22.

The thicknesses TK1a and TK1b of the circuit layer 112 are adjusted so that a specific color may not be strong viewed (e.g., may be less visible) when viewed in a specific direction. For example, the WAD characteristic of the display device 1000 (see, e.g., FIG. 1) may be improved by adjusting the thicknesses TK1a and TK1b of the circuit layer 112. For example, as the thicknesses TK1a of the circuit layer 112 gradually decreases, a portion of the first light-emitting portion EL11 of the first emission layer EL1a may have a shape inclined toward the lower surface 100BS of the display panel 100 (e.g., may have a declined shape). Thus, to compensate for the decreased WAD characteristic due to the inclined portion, the slope of another emission layer may be adjusted as described in more detail below.

The first electrode AE1a may and the second first electrode AE2a may be disposed on the circuit layer 112. The first electrode AE1a may have a first portion AE11 and a second portion AE12 (e.g., see, e.g., FIG. 10A), and the second first electrode AE2a may include a third portion AE23 and a fourth portion AE24 (e.g., see, e.g., FIG. 10B). The first portion AE11 and the second portion AE12 may be connected to each other and have integrated shapes (e.g., may be integral with each other), and the third portion AE23 and the fourth portion AE24 may be connected to each other and have integrated shapes (e.g., may be integral with each other).

The thickness TK1a of the circuit layer 112 overlapping (e.g., under) the first portion AE11 may be smaller than the thickness TK1b of the circuit layer 112 overlapping (e.g., under) the fourth portion AE24. As the thicknesses TK1a and TK1b of the circuit layer 112 are adjusted, a first angle AG1 between the first portion AE11 and the second portion AE12 and a second angle AG2 between the third portion AE23 and the fourth portion AE24 may be different from each other. For example, the first angle AG1 may be larger than about 180 degrees (e.g., may be a reflex angle), and the second angle AG2 may be smaller than about 180 degrees (e.g., may be an obtuse angle).

The first emission layer EL1a is disposed on the first electrode AE1a, and the second emission layer EL2a may be disposed on the second first electrode AE2a. The first emission layer EL1a may include the first light-emitting portion EL11 and the second light-emitting portion EL12, and the second emission layer EL2a may include the third light-emitting portion EL23 and the fourth light-emitting portion EL24.

The first light-emitting portion EL11 and the second light-emitting portion EL12 may be spaced apart from each other (e.g., may be adjacent to each other) in the first direction DR1. In addition, the first light-emitting portion EL11 and the second light-emitting portion EL12 may have integrated shapes that are connected to each other. The third light-emitting portion EL23 and the fourth light-emitting portion EL24 may be adjacent to each other in the first direction DR1. In addition, the third light-emitting portion EL23 and the fourth light-emitting portion EL24 may have integrated shapes that are connected to each other.

The first light-emitting portion EL11 may be further adjacent to (or nearer to) the second sub-region AR21 than the second light-emitting portion EL12 is, and the fourth light-emitting portion EL24 may be further adjacent to (or nearer to) the second sub-region AR22 than the third light-emitting portion EL23 is. The closer to the second sub-region AR21, the smaller the thickness TK1a of the circuit layer 112 disposed under the first light-emitting portion EL11 may be, and the closer to the second sub-region AR22, the larger the thickness TK1b of the circuit layer 112 disposed under the fourth light-emitting portion EL24 (e.g., the thicknesses TK1a of the circuit layer 112 may decrease as it approaches the second sub-region AR21, and the thickness TK1b of the circuit layer 112 may increase as it approaches the second sub-region AR22).

The first light-emitting portion EL11 may be disposed on the first portion AE11, the second light-emitting portion EL12 may be disposed on the second portion AE12, the third light-emitting portion EL23 may be disposed on the third portion AE23, and the fourth light-emitting portion EL24 may be disposed on the fourth portion AE24. Thus, a first angle AG1a formed between the first light-emitting portion EL11 and the second light-emitting portion EL12 and a second angle AG2a formed between the third light-emitting portion EL23 and the fourth light-emitting portion EL24 may be different from each other. For example, the first angle AG1a may be larger than about 180 degrees, and the second angle AG2a may be smaller than about 180 degrees.

The first light-emitting portion EL11 may be inclined in a direction from the second light-emitting portion EL12 toward the lower surface 100BS of the display panel 100. The fourth light-emitting portion EL24 may be inclined in a direction from the third light-emitting portion EL23 toward the upper surface 100US of the display panel 100.

The second emission layer EL2a1 (see, e.g., FIG. 9) may be spaced apart from the second emission layer EL2a in the second direction DR2. The second emission layer EL2a1 may emit the same color light as the second emission layer EL2a. For example, the second emission layer EL2a1 may emit green light. The angle formed by the third light-emitting portion EL231 and the fourth light-emitting portion EL241 may substantially be the same as the angle formed by the third light-emitting portion EL23 and the fourth light-emitting portion EL24.

The fifth light-emitting portion EL35 and the sixth light-emitting portion EL36 of the third emission layer EL3a (see, e.g., FIG. 9) may have a shape substantially corresponding to the first light-emitting portion EL11 and the second light-emitting portion EL12 of the first emission layer EL1a as shown in FIG. 10A. The fifth light-emitting portion EL35 may extend from the sixth light-emitting portion EL36 and may be inclined toward the lower surface 100BS of the display panel 100. For example, the first light-emitting portion EL11 may correspond to the fifth light-emitting portion EL35, and the second light-emitting portion EL12 may correspond to the sixth light-emitting portion EL36. Thus, a detailed description of the third light-emitting portion EL3a may be omitted.

According to an embodiment of the present disclosure, the first light-emitting portion EL11 and the fifth light-emitting portion EL35 may be inclined to provide light in a first direction L1. The fourth light-emitting portion EL24 may be inclined to provide light in a second direction L2. The first direction L1 and the second direction L2 may be substantially the same direction. Thus, when viewed in a direction DRX, a change of color coordinates may be decreased due to the first light-emitting portion EL11 that provides blue light, the fourth light-emitting portion EL24 that provides green light, and the fifth light-emitting portion EL35 that provides red light. Thus, as the WAD characteristic of the display device 1000 (see, e.g., FIG. 1) is improved, the display quality of the display device 1000 may be improved.

Figure 11A:
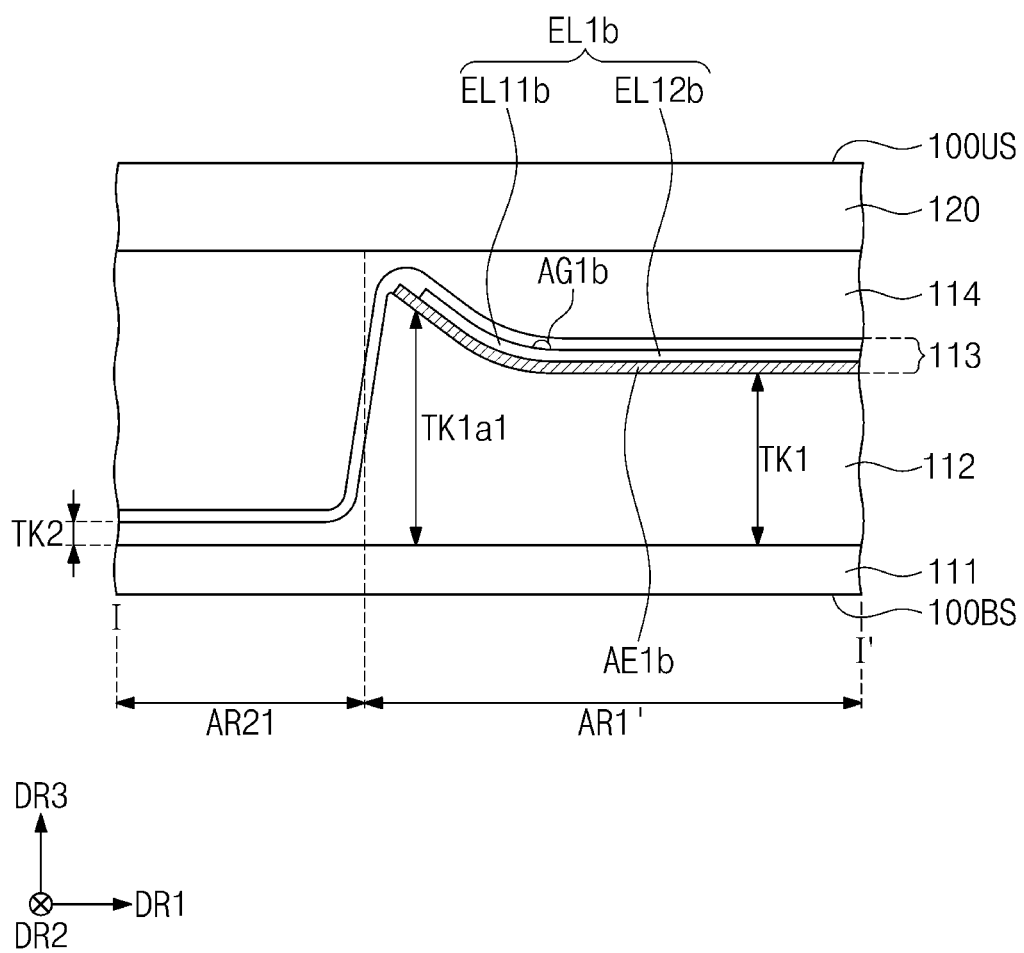
FIG. 11A is a cross-sectional view taken along the line I-I' in FIG. 9 according to an embodiment of the present disclosure.
Figure 11B:
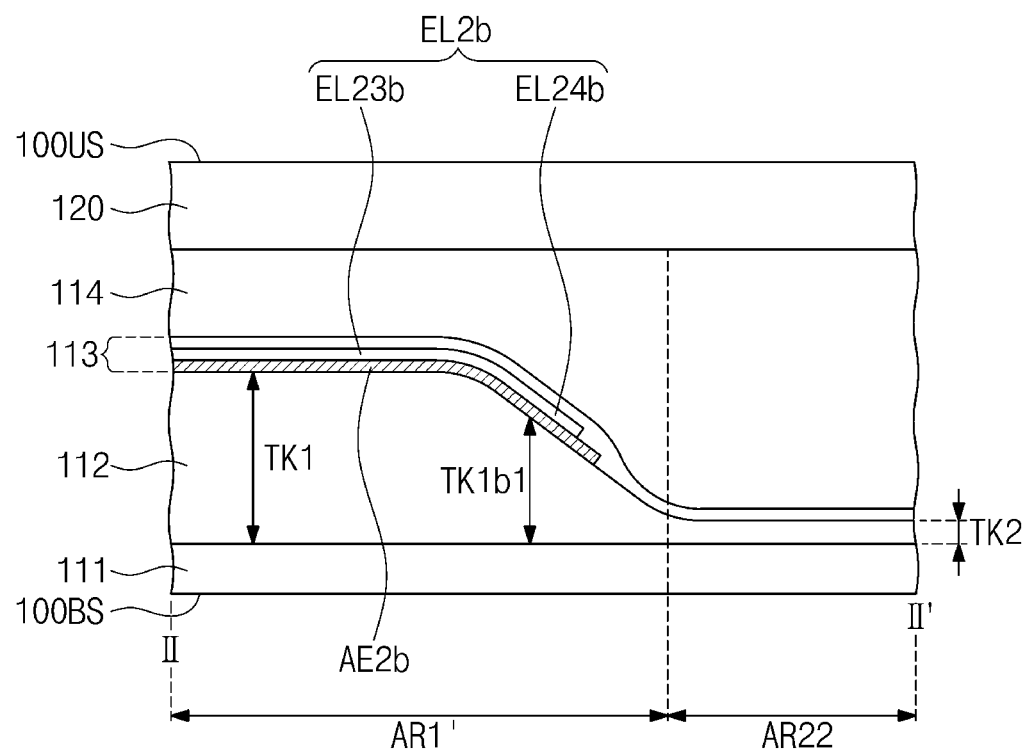
FIG. 11B is a cross-sectional view taken along the line II-II' in FIG. 9 according to an embodiment of the present disclosure.
Figure 11C:
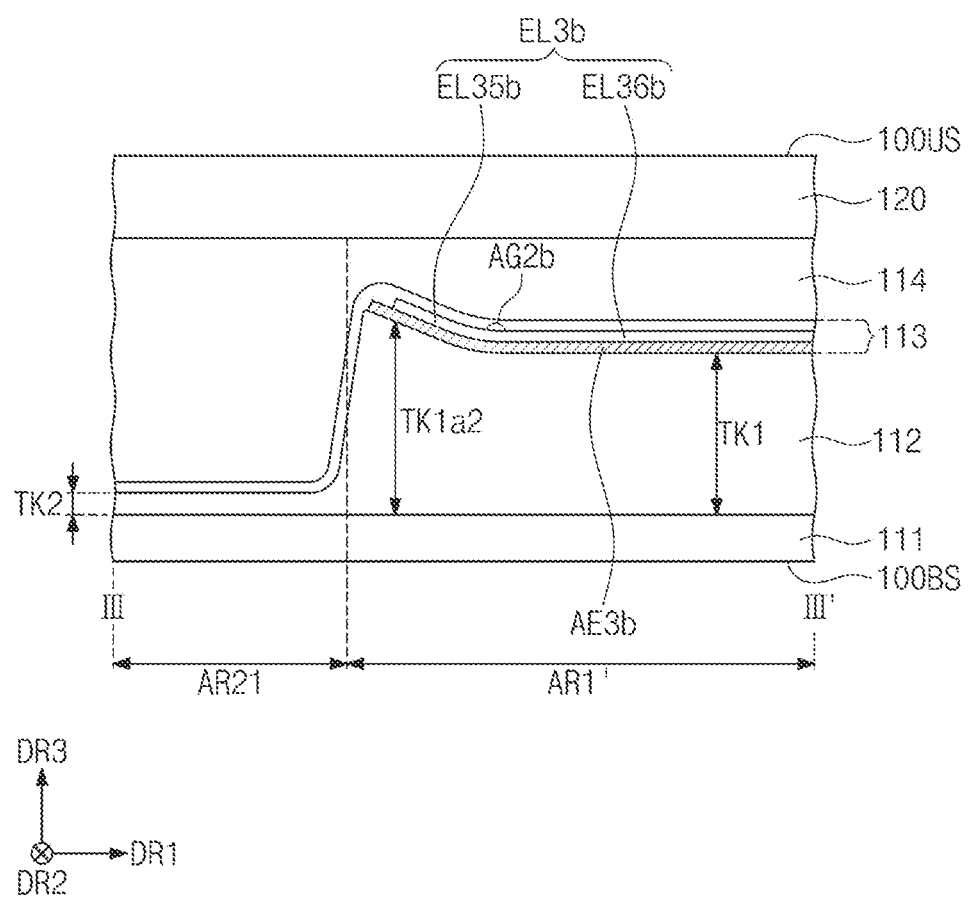
FIG. 11C is a cross-sectional view taken along the line III-III' in FIG. 9 according to an embodiment of the present disclosure.

FIG. 11A is a cross-sectional view taken along the line I-I' in FIG. 9 according to an embodiment of the present disclosure, FIG. 11B is a cross-sectional view taken along the line II-II' in FIG. 9 according to an embodiment of the present disclosure, and FIG. 11C is a cross-sectional view taken along the line III-III' in FIG. 9 according to an embodiment of the present disclosure.

Referring to FIG. 11A, the first emission layer EL1b and the first electrode AE1b disposed under the first emission layer EL1b are illustrated. Referring to FIG. 11B, the second emission layer EL2b and a first electrode AE2b (hereinafter, second first electrode) disposed under the second emission layer EL2b. Referring to FIG. 11C, the third emission layer EL3b and a first electrode AE3b (hereinafter, third first electrode) disposed under the third emission layer EL3b.

The thicknesses TK1a1, TK1a2, and TK1b1 of the circuit layer 112 disposed on a portion of the first sub-region AR1' adjacent to the second sub-regions AR21 and AR22 may gradually decrease or gradually increases toward the second sub-regions AR21 and AR22.

The thickness TK1a1 of the circuit layer 112 disposed under the first light-emitting portion EL11b may increase as the circuit layer 112 approaches the second sub-region AR21. The thickness TK1b1 of the circuit layer 112 disposed under the fourth light-emitting portion EL24b may decrease as the circuit layer 112 approaches the second sub-region AR22. The thickness TK1a2 of the circuit layer 112 disposed under the fifth light-emitting portion EL35b may increase as the circuit layer 112 approaches the second sub-region AR21.

In an embodiment of the present disclosure, the WAD characteristic may be improved by adjusting the thicknesses of a portion of the circuit layer 112 under the first emission layer EL1b and a portion of the circuit layer 112 under the third emission layer EL3b. For example, the slope of the first light-emitting portion EL11b and the slope of the fifth light-emitting portion EL35b may be adjusted to provide light in the similar direction as the fourth light-emitting portion EL24b.

The first emission layer EL1b may be a layer that emits blue light, and the second emission layer EL2b may be a layer that emits red light. Changes in brightness ratio according to viewing angle may vary for each color. Thus, the slope of the first light-emitting portion EL11b and the slope of the fifth light-emitting portion EL35b may be adjusted to be different from each other.

For example, changes in brightness ratio according to viewing angle may be greater for blue light than for red light. Thus, the slope of the first light-emitting portion EL11b may be adjusted to be larger than the slope of the fifth light-emitting portion EL35b. A first angle AG1b between the first light-emitting portion EL11b and the second light-emitting portion EL12b may be smaller than a second angle AG2b between the fifth light-emitting portion EL35b and the sixth light-emitting portion EL36b. However, this is merely an example and may be these angles suitably modified.

Figure 12:
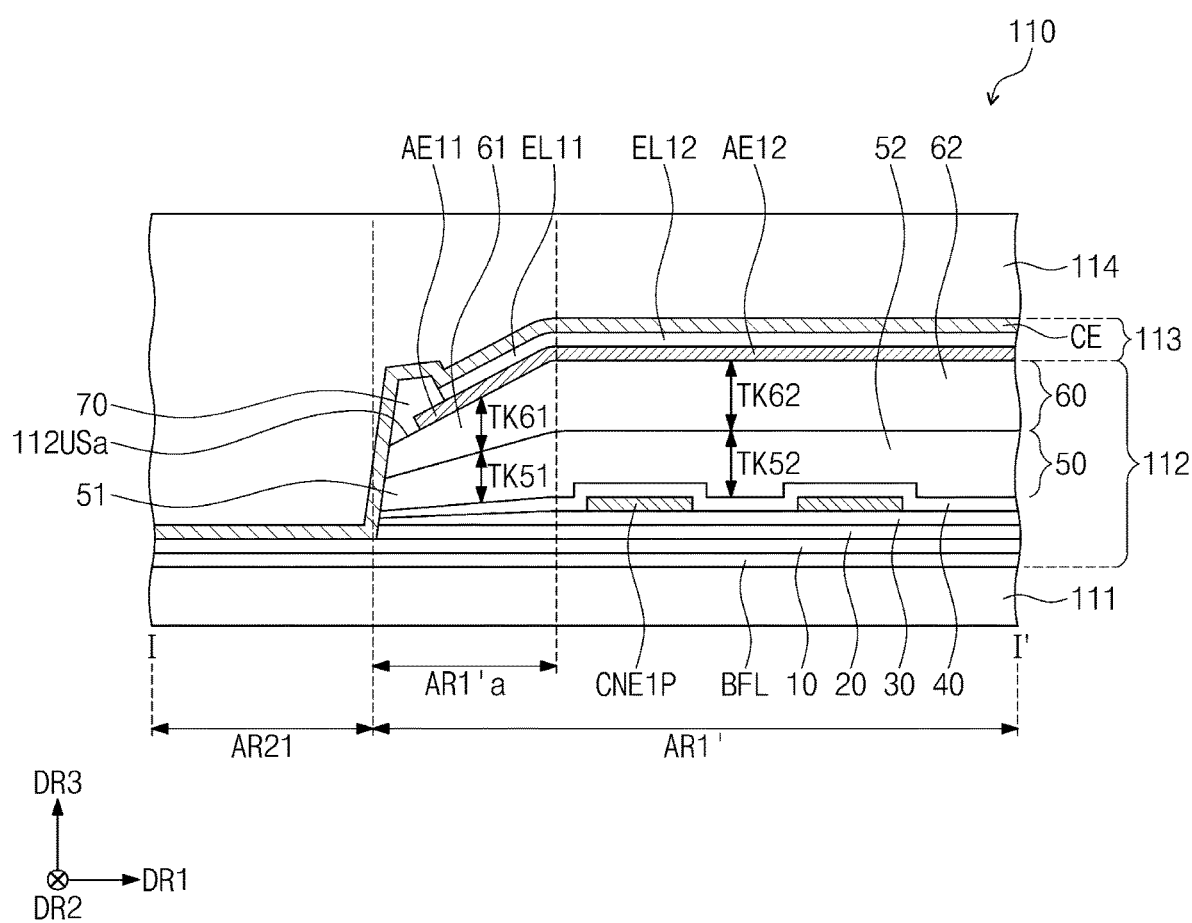
FIG. 12 is a cross-sectional view taken along the line I-I' in FIG. 9 according to an embodiment of the present disclosure.
Figure 13:
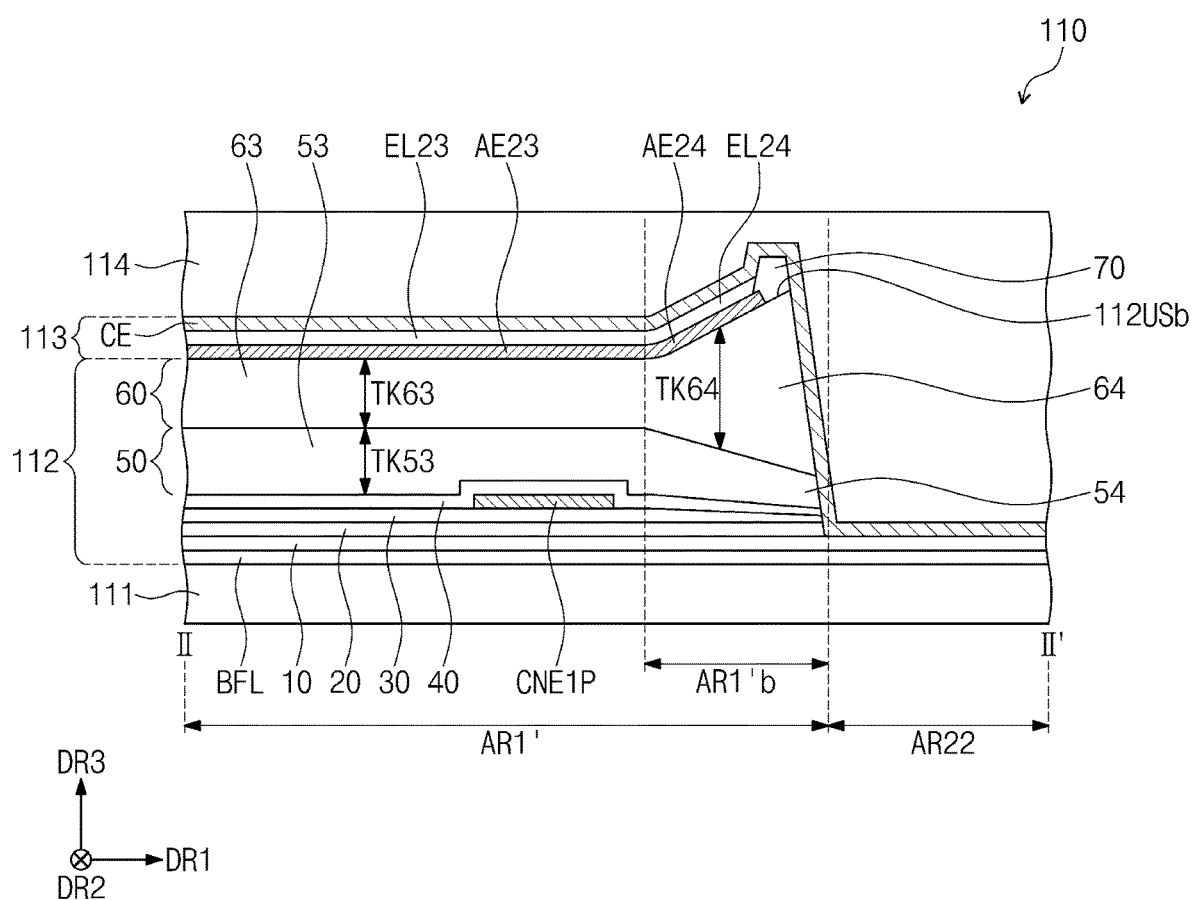
FIG. 13 is a cross-sectional view taken along the line II-II' in FIG. 9 according to an embodiment of the present disclosure.

FIG. 12 is a cross-sectional view taken along the line I-I' in FIG. 9 according to an embodiment of the present disclosure. In more detail, FIG. 12 is a view illustrating a lamination relationship of the display layer 110 illustrated in FIG. 10A. FIG. 13 is a cross-sectional view taken along the line II-II' in FIG. 9 according to an embodiment of the present disclosure. In more detail, FIG. 13 is a view illustrating a lamination relationship of the display layer 110 illustrated in FIG. 10B.

Referring to FIG. 12, the first sub-region AR1' may include an adjacent region AR1'a adjacent to the second sub-region AR21. In the second sub-region AR21, only the buffer layer BFL and the first insulating layer 10 from among the circuit layer 112 may be disposed, but the present disclosure is not limited thereto. In addition, FIG. 12 and FIG. 13 each illustrates that the second electrode CE is disposed in the second sub-regions AR21 and AR22, but the present disclosure is not limited thereto. For example, a portion of the second electrode CE disposed in the second sub-regions AR21 and AR22 may be removed (e.g., the second electrode CE may be omitted from the second sub-regions AR21 and AR22). In such an embodiment, the transmittance of the second sub-regions AR21 and AR22 may be improved compared to an embodiment in which the second electrode CE is present in the second sub-regions AR21 and AR22.

The patterns CNE1P may not be disposed in the adjacent region AR1'a. The upper surface 112USa of the circuit layer 112 may have an inclined shape at where the patterns CNE1P are omitted (e.g., in the adjacent region AR1'a).

The first portion AE11 and the first light-emitting portion EL11, which are disposed in the adjacent region AR1'a, may have a shape inclined with respect to each of the second portion AE12 and the second light-emitting portion EL12.

Referring to FIG. 13, the first sub-region AR1' may further include an adjacent region AR1'b adjacent to the second sub-region AR22. The upper surface 112USb of the circuit layer 112 in the adjacent region AR1'b may have an inclined shape.

In an embodiment of the present disclosure, the upper surface 112USa of the circuit layer 112 in the adjacent region AR1'a may be inclined toward the base layer 111, and the upper surface 112USb of the circuit layer 112 in the adjacent region AR1'b may be inclined away from the base layer 111. Thus, the first light-emitting portion EL11 and the fourth light-emitting portion EL24 provide light in similar directions so that the WAD characteristic of the display device 1000 (see, e.g., FIG. 1) may be improved.

To adjust the slope of the upper surface 112USb of the circuit layer 112, at least a portion from among (e.g., at least some of) the layers of the circuit layer 112 may be used (e.g., may be formed thicker or thinner). For example, any one from among the fifth insulating layer 50 and the sixth insulating layer 60 may be used. Hereinafter, the fifth insulating layer 50 is referred to as a first intermediate insulating layer 50, and the sixth insulating layer 60 is referred to as a second intermediate insulating layer 60.

The first intermediate insulating layer 50 and the second intermediate insulating layer 60 may be layers disposed in the first sub-region AR1'. The first intermediate insulating layer 50 may be disposed under the first emission layer EL1a and the second emission layer EL2a, and the second intermediate insulating layer 60 may be disposed on the first intermediate insulating layer 50. In addition, the second intermediate insulating layer 60 may be disposed between the first intermediate insulating layer 50 and the first emission layer EL1a and between the first intermediate insulating layer 50 and the second emission layer EL2a. When viewed in a plane, the first intermediate insulating layer 50 and the second intermediate insulating layer 60 may each be spaced apart from (e.g., may not be disposed in) the second sub-regions AR21 and AR22. The phrase "viewed in a plane" indicates viewing in the thickness direction of the display layer 110 and may also indicate "viewed in the third direction DR3".

The first intermediate insulating layer 50 may include: a first insulating portion 51 disposed under the first light-emitting portion EL11; a second insulating portion 52 disposed under the second light-emitting portion EL12; a third insulating portion 53 disposed under the third light-emitting portion EL23; and a fourth insulating portion 54 disposed under the fourth light-emitting portion EL24. The second intermediate insulating layer 60 may include: a fifth insulating portion 61 disposed under the first light-emitting portion EL11; a sixth insulating portion 62 disposed under the second light-emitting portion EL12; a seventh insulating portion 63 disposed under the third light-emitting portion EL23; and an eighth insulating portion 64 disposed under the fourth light-emitting portion EL24.

According to an embodiment of the present disclosure, the slope of the fourth light-emitting portion EL24 may be adjusted by forming at least any one from among the first to eighth insulating portions 51, 52, 53, 54, 61, 62, 63, and 64 to have a thickness larger than the thickness of another portion. For example, the slope of the fourth light-emitting portion EL24 may be adjusted by adjusting the thickness TK64 of the eighth insulating portion 64. The thickness TK64 of the eighth insulating portion 64 may be larger than the respective thicknesses TK61, TK62, and TK63 of the fifth to seventh insulating portions 61, 62, and 63.

The first intermediate insulating layer 50 may be formed by using a binary mask, and the second intermediate insulating layer 60 may be formed by using a halftone mask. For example, the second intermediate insulating layer 60 may include a positive-type photoresist material. The halftone mask may include: a transmissive portion having the highest light transmittance; a light-blocking portion having lowest transmittance; and a semi-transmissive portion having medium light transmittance. The transmissive portion may be disposed corresponding to the second sub-regions AR21 and AR22, the semi-transmissive portion may be disposed corresponding to a portion of the first sub-region AR1' excluding (e.g., other than) the adjacent region AR1'b, and the light-blocking portion may be disposed corresponding to the adjacent region AR1'b. The eighth insulating portion 64 may be formed by adjusting the areas or positions of the semi-transmissive portion and the light-blocking portion.

Figure 14:
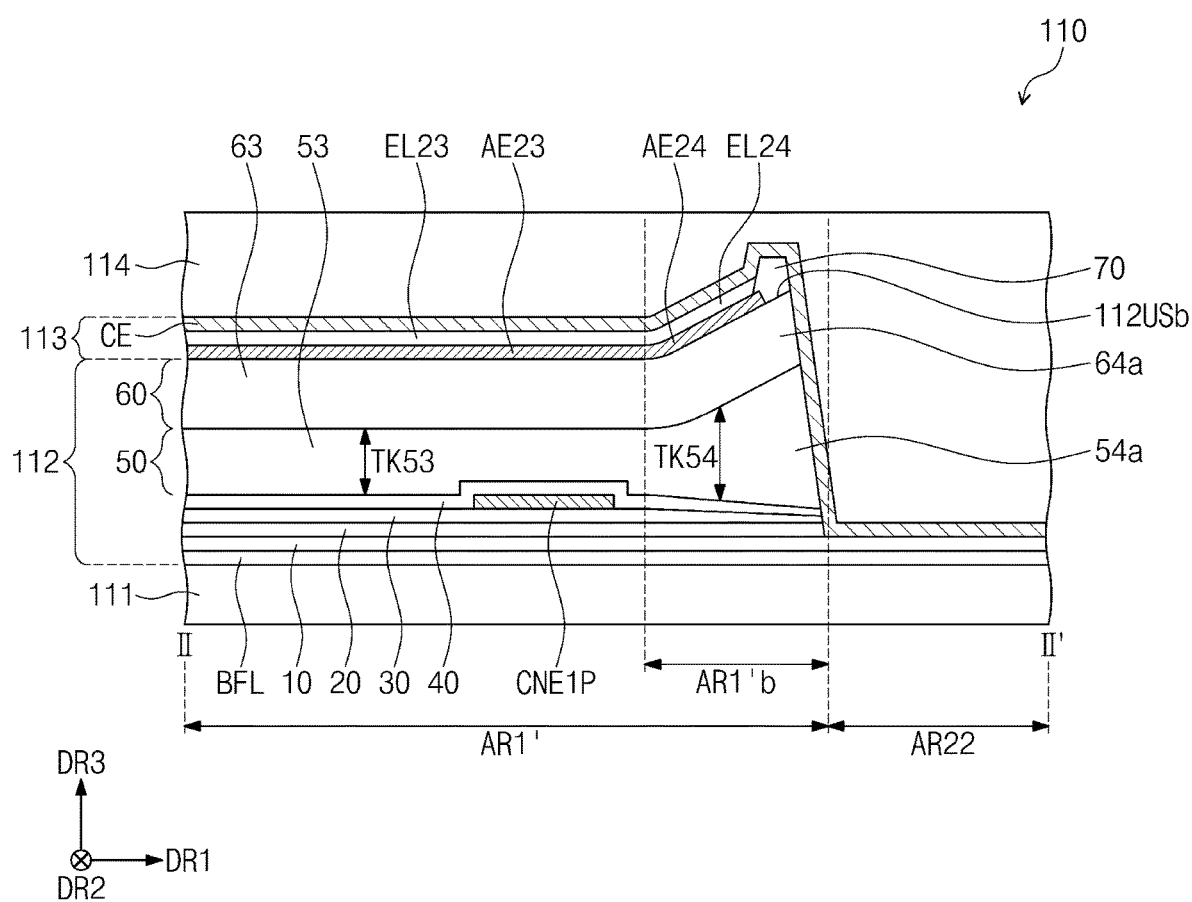
FIG. 14 is a cross-sectional view taken along the line II-II' in FIG. 9 according to an embodiment of the present disclosure.

FIG. 14 is a cross-sectional view taken along the line II-II' in FIG. 9 according to an embodiment of the present disclosure. In more detail, FIG. 14 is a view illustrating the lamination relationship of the display layer 110 illustrated in FIG. 10B. In describing FIG. 14, the same components as those described above with respect to FIG. 13 are referred to by the same symbol or reference numeral, and the description of FIG. 14 may focus on differences with the embodiment shown in FIG. 13.

Referring to FIGS. 12 and 14, the first intermediate insulating layer 50 may include: a first insulating portion 51 disposed under the first light-emitting portion EL11; a second insulating portion 52 disposed under the second light-emitting portion EL12; a third insulating portion 53 disposed under the third light-emitting portion EL23; and a fourth insulating portion 54a disposed under the fourth light-emitting portion EL24. The second intermediate insulating layer 60 may include: a fifth insulating portion 61 disposed under the first light-emitting portion EL11; a sixth insulating portion 62 disposed under the second light-emitting portion EL12; a seventh insulating portion 63 disposed under the third light-emitting portion EL23; and an eighth insulating portion 64a disposed under the fourth light-emitting portion EL24.

According to an embodiment of the present disclosure, the slope of the fourth light-emitting portion EL24 may be adjusted by forming at least any one from among the first to eighth insulating portions 51, 52, 53, 54a, 61, 62, 63, and 64a to have a thickness larger than the thickness of another portion. For example, the slope of the fourth light-emitting portion EL24 may be adjusted by adjusting the thickness TK54 of the fourth insulating portion 54a. The thickness TK54 of the fourth insulating portion 54a may be larger than the respective thicknesses TK51, TK52, and TK53 of the first to third insulating portions 51, 52, and 53.

Figure 15:
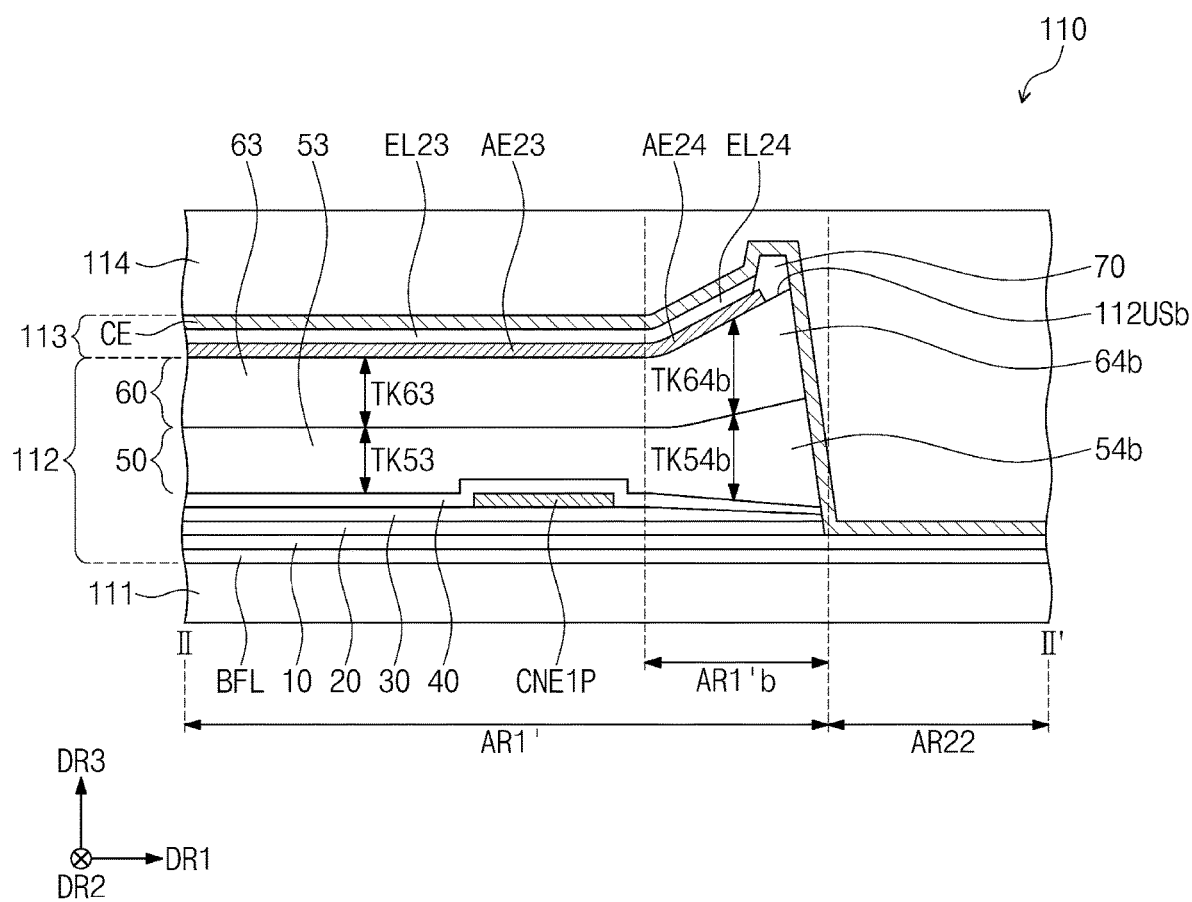
FIG. 15 is a cross-sectional view taken along the line II-II' in FIG. 9 according to an embodiment of the present disclosure.

FIG. 15 is a cross-sectional view taken along the line II-II' in FIG. 9 according to an embodiment of the present disclosure. In more detail, FIG. 15 is a view illustrating the lamination relationship of the display layer 110 illustrated in FIG. 10B. In describing FIG. 15, the same components as the components described in FIG. 13 are referred to by the same symbol or reference numeral, and the description of FIG. 15 may focus on differences with the previously-described embodiments.

Referring to FIGS. 12 and 15, the first intermediate insulating layer 50 may include: a first insulating portion 51 disposed under the first light-emitting portion EL11; a second insulating portion 52 disposed under the second light-emitting portion EL12; a third insulating portion 53 disposed under the third light-emitting portion EL23; and a fourth insulating portion 54b disposed under the fourth light-emitting portion EL24. The second intermediate insulating layer 60 may include: a fifth insulating portion 61 disposed under the first light-emitting portion EL11; a sixth insulating portion 62 disposed under the second light-emitting portion EL12; a seventh insulating portion 63 disposed under the third light-emitting portion EL23; and an eighth insulating portion 64b disposed under the fourth light-emitting portion EL24.

According to an embodiment of the present disclosure, the slope of the fourth light-emitting portion EL24 may be adjusted by forming at least any one from among the first to eighth insulating portions 51, 52, 53, 54b, 61, 62, 63, and 64b to have a thickness larger than the thickness of another portion. For example, the slope of the fourth light-emitting portion EL24 may be adjusted by adjusting the thickness TK54b of the fourth insulating portion 54b and the thickness TK64b of the eighth insulating portion 64b. The thickness TK54b of the fourth insulating portion 54b may be larger than the respective thicknesses TK51, TK52, and TK53 of the first to third insulating portions 51, 52 and 53, and the thickness TK64b of the eighth insulating portion 64a may be larger than the respective thicknesses TK61, TK62, and TK63 of the fifth to seventh insulating portions 61, 62, and 63.

In an embodiment of the present disclosure, the first intermediate insulating layer 50 and the second intermediate insulating layer 60 may be formed by using a halftone mask. The transmissive portion may be disposed corresponding to the second sub-regions AR21 and AR22, the semi-transmissive portion may be disposed corresponding to a portion of the first sub-region AR1' excluding the adjacent region AR1'b, and the light-blocking portion may be disposed corresponding to the adjacent region AR1'b. The fourth insulating portion 54b and the eighth insulating portion 64b may each be formed by adjusting the areas or positions of the semi-transmissive portion and the light-blocking portion.

Figure 16:
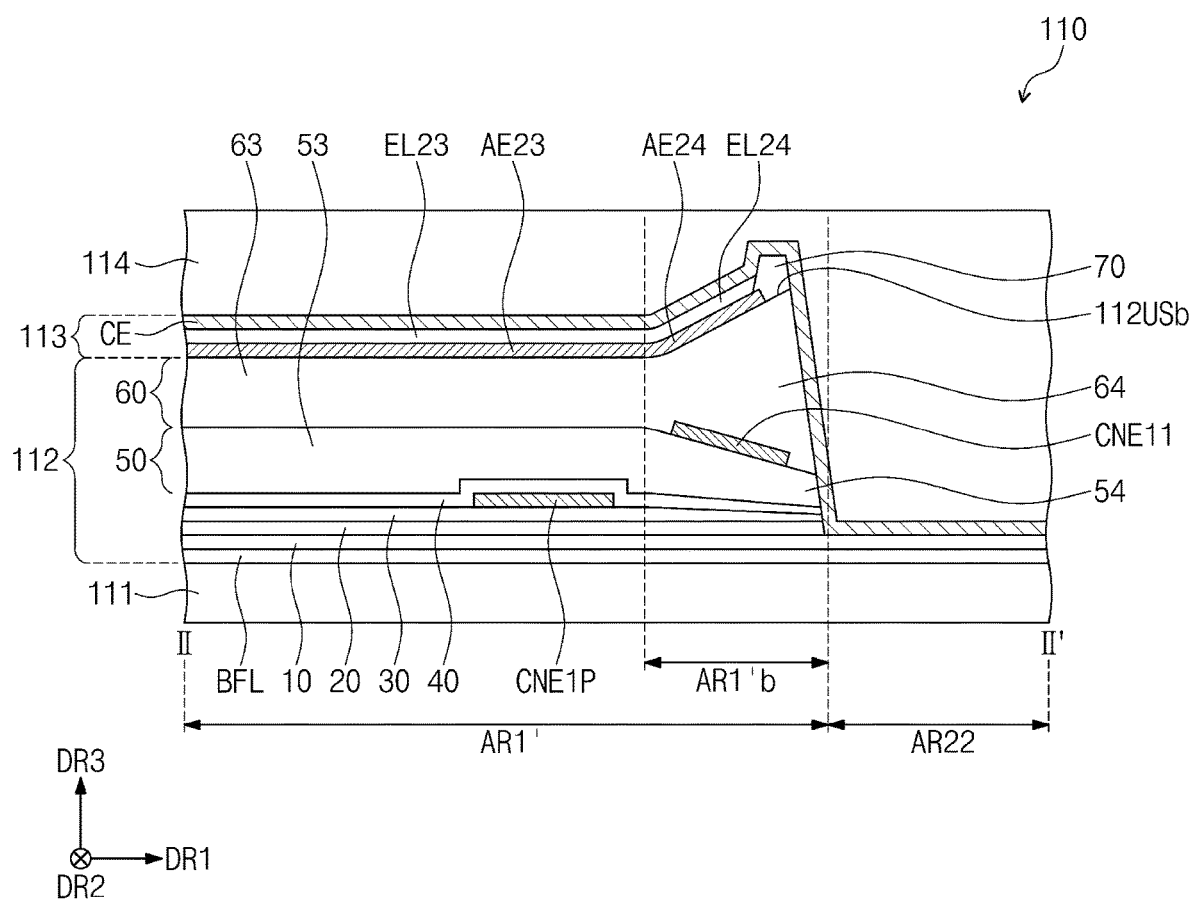
FIG. 16 is a cross-sectional view taken along the line II-II' in FIG. 9 according to an embodiment of the present disclosure.

FIG. 16 is a cross-sectional view taken along the line II-II' in FIG. 9 according to an embodiment of the present disclosure. In more detail, FIG. 16 is a view illustrating the lamination relationship of the display layer 110 illustrated in FIG. 10B. In describing FIG. 16, the same components as the components described in FIG. 13 are referred to by the same symbol or reference numeral, and the description of FIG. 16 may focus on differences with the previously-described embodiments.

Referring to FIG. 16, aside from the method of adjusting the thickness of the first intermediate insulating layer 50 and/or the thickness of the second intermediate insulating layer 60, a method of adding a pattern to the adjacent region AR1'b may also be used. For example, a pattern may be added by using a layer having a relatively large thickness from among metallic layers.

In an embodiment of the present disclosure, a first metal pattern CNE11 may be further disposed between the fourth insulating portion 54 and the eighth insulating portion 64. The first metal pattern CNE11 may be a pattern disposed on the same layer as the second connecting electrode CNE2 (see, e.g., FIG. 6). For example, the thickness of the first metal pattern CNE11 may be about 6,000 angstroms, but the present disclosure is not limited thereto.

Figure 17:
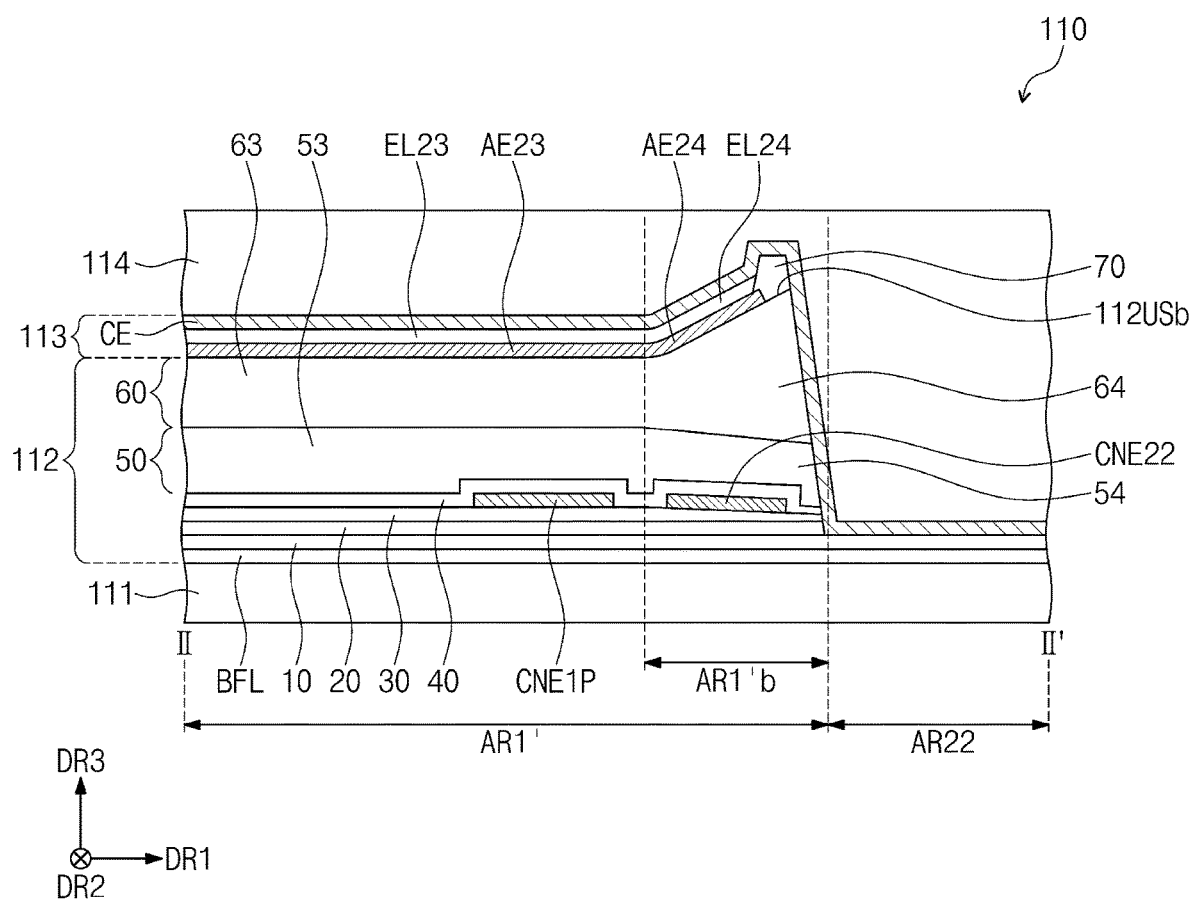
FIG. 17 is a cross-sectional view taken along the line II-II' in FIG. 9 according to an embodiment of the present disclosure.

FIG. 17 is a cross-sectional view taken along the line II-II' in FIG. 9 according to an embodiment of the present disclosure. In more detail, FIG. 17 is a view illustrating the lamination relationship of the display layer 110 illustrated in FIG. 10B. In describing FIG. 17, the same components as the components described in FIG. 13 are referred to by the same symbol or reference numeral, and the description of FIG. 17 may focus on differences with the previously-described embodiments.

Referring to FIG. 17, a second metal pattern CNE22 may be disposed under the fourth insulating portion 54. The second metal pattern CNE22 may be a pattern disposed on the same layer as the first connecting electrode CNE1 (see, e.g., FIG. 6). For example, the thickness of the second metal pattern CNE22 may be about 6,000 angstroms, but the present disclosure is not limited thereto.

Figure 18:
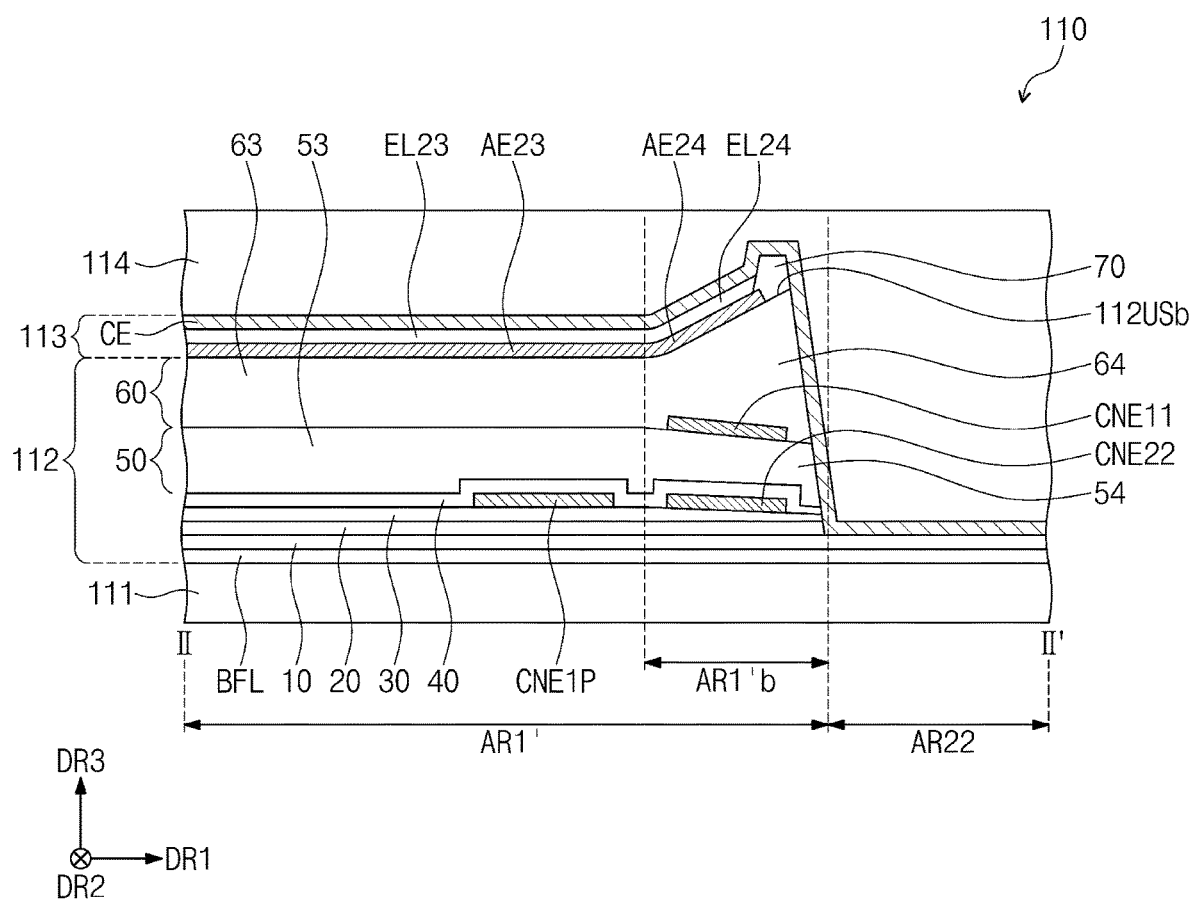
FIG. 18 is a cross-sectional view taken along the line II-II' in FIG. 9 according to an embodiment of the present disclosure.

FIG. 18 is a cross-sectional view taken along the line II-II' in FIG. 9 according to an embodiment of the present disclosure. In more detail, FIG. 18 is a view illustrating the lamination relationship of the display layer 110 illustrated in FIG. 10B. In describing FIG. 18, the same components as the components described in FIG. 13 are referred to by the same symbol or reference numeral, and the description of FIG. 18 may focus on differences with the previously-described embodiments.

Referring to FIG. 18, the first metal pattern CNE11 is disposed between the fourth insulating portion 54 and the eighth insulating portion 64, and the second metal pattern CNE22 may be disposed under the fourth insulating portion 54. FIGS. 16 to 18 exemplarily illustrate configurations in which at least one of the first metal pattern CNE11 and the second metal pattern CNE22 is added to the structure illustrated in FIG. 13, but the embodiment of the present disclosure is not limited thereto. For example, at least one of the first metal pattern CNE11 and the second metal pattern CNE22 may also be added to the structures illustrated in FIGS. 14 and 15.

As described above, the WAD characteristic of a display device may be improved by adjusting the thickness of a portion from among the layers disposed under the light-emitting portion of a display panel. As the WAD characteristic is improved, the display quality of a display device may be improved.

The present disclosure has been described with reference to exemplary embodiments. However, it will be understood by those skilled in the art that various modifications and variations may be made in the present disclosure without departing from the spirit and technical area of the present disclosure be set forth in claims and their equivalents. Hence, the scope of the present disclosure shall be determined by the technical scope of the accompanying claims and their equivalents.

What is claimed is:

1. A display device comprising:
 a display panel having a first region and a second region having a higher resolution than the first region, the first region having a first sub-region and a second sub-region; and
 an electronic module under the first region of the display panel,
 wherein the display panel comprises:
  a first emission layer in the first sub-region; and
  a second emission layer in the first sub-region and spaced apart from the first emission layer,
 wherein the first emission layer has a first light-emitting portion and a second light-emitting portion adjacent to the first light-emitting portion in a first direction,
 wherein the second emission layer has a third light-emitting portion and a fourth light-emitting portion adjacent to the third light-emitting portion in the first direction,
 wherein the first light-emitting portion is inclined from the second light-emitting portion toward a lower surface of the display panel, and
 wherein the fourth light-emitting portion is inclined from the third light-emitting portion toward an upper surface of the display panel.

2. The display device of claim 1, wherein:
 the first light-emitting portion is closer to the second sub-region than the second light-emitting portion is; and
 the fourth light-emitting portion is closer to the second sub-region than the third light-emitting portion is.

3. The display device of claim 1, wherein:
 the display panel further comprises a third emission layer in the first sub-region;

the third emission layer is spaced apart from the second emission layer in a second direction crossing the first direction;

the third emission layer has a fifth light-emitting portion and a sixth light-emitting portion adjacent to the fifth light-emitting portion in the first direction; and the fifth light-emitting portion is inclined from the sixth light-emitting portion toward the upper surface of the display panel.

4. The display device of claim 3, wherein the first emission layer is configured to emit blue light or red light, and wherein the second emission layer and the third emission layer are configured to emit green light.

5. The display device of claim 4, wherein an angle between the third light-emitting portion and the fourth light-emitting portion and an angle between the fifth light-emitting portion and the sixth light-emitting portion are substantially the same.

6. The display device of claim 3, wherein the first emission layer is configured to emit green light, the second emission layer is configured to emit blue light, and the third emission layer is configured to emit red light.

7. The display device of claim 6, wherein an angle between the third light-emitting portion and the fourth light-emitting portion is different from an angle between the fifth light-emitting portion and the sixth light-emitting portion.

8. The display device of claim 1, wherein:

an angle between an upper surface of the first light-emitting portion and an upper surface of the second light-emitting portion is greater than about 180 degrees; and an angle between an upper surface of the third light-emitting portion and an upper surface of the fourth light-emitting portion is less than about 180 degrees.

9. The display device of claim 1, wherein the display panel further comprises:

a first intermediate insulating layer in the first sub-region; and a second intermediate insulating layer in the first sub-region and between the first intermediate insulating layer and the first emission layer and between the first intermediate insulating layer and the second emission layer.

10. The display device of claim 9, wherein, when viewed in a plane, the first intermediate insulating layer and the second intermediate insulating layer are spaced apart from the second sub-region.

11. The display device of claim 9, wherein the first intermediate insulating layer has:

a first insulating portion under the first light-emitting portion;

a second insulating portion under the second light-emitting portion;

a third insulating portion under the third light-emitting portion; and a fourth insulating portion under the fourth light-emitting portion, and wherein the second intermediate insulating layer has:

a fifth insulating portion under the first light-emitting portion;

a sixth insulating portion under the second light-emitting portion;

a seventh insulating portion under the third light-emitting portion; and an eighth insulating portion under the fourth light-emitting portion, wherein any one from among the first to eighth insulating portions has a different thickness from another one of the first to eighth insulating portions.

12. The display device of claim 11, wherein a thickness of the first insulating portion is smaller than a thickness of the fourth insulating portion.

13. The display device of claim 11, wherein a thickness of the fifth insulating portion is smaller than a thickness of the eighth insulating portion.

14. The display device of claim 11, wherein:

a thickness of the first insulating portion is smaller than a thickness of the fourth insulating portion; and a thickness of the fifth insulating portion is smaller than a thickness of the eighth insulating portion.

15. The display device of claim 11, wherein the display panel further comprises a first metal pattern between the fourth insulating portion and the eighth insulating portion.

16. The display device of claim 15, wherein the display panel further comprises a second metal pattern under the fourth insulating portion, and wherein the fourth insulating portion is between the first metal pattern and the second metal pattern.

17. The display device of claim 11, wherein the display panel further comprises a metal pattern under the fourth insulating portion.

18. The display device of claim 1, wherein a transmittance of the second sub-region is higher than a transmittance of the first sub-region, and wherein the electronic module is a camera module.

19. A display device comprising:

a display panel having an effective region and a transmissive region extending around a periphery of the effective region; and an electronic module under the display panel, wherein the display panel comprises:

a first emission layer having a first light-emitting portion and a second light-emitting portion, the first light-emitting portion being in the effective region and adjacent to the transmissive region; and a second emission layer in the effective region and having a third light-emitting portion and a fourth light-emitting portion adjacent to the transmissive region, wherein:

an angle between an upper surface of the first light-emitting portion and an upper surface of the second light-emitting portion is greater than about 180 degrees, and an angle between an upper surface of the third light-emitting portion and an upper surface of the fourth light-emitting portion is less than about 180 degrees.

20. The display device of claim 19, wherein the display panel further comprises:

a first intermediate insulating layer in the effective region; and a second intermediate insulating layer in the effective region, between the first intermediate insulating layer and the first emission layer, and between the first intermediate insulating layer and the second emission layer, and wherein a thickness from a lower surface of the first intermediate insulating layer to the first light-emitting portion is smaller than a thickness from the lower surface of the first intermediate insulating layer to the fourth light-emitting portion.

21. A display device comprising:
a base layer;
a circuit layer on the base layer;
a first electrode on the circuit layer; and
a second electrode on the circuit layer and spaced apart from the first electrode, wherein:
the first electrode has a first portion and a second portion forming a first angle that is greater than about 180 degrees with the first portion; and
the second electrode has a third portion and a fourth portion forming a second angle that is smaller than about 180 degrees with the third portion.

22. The display device of claim 21, wherein a thickness of the circuit layer overlapping the first portion is smaller than a thickness of the circuit layer overlapping the fourth portion.

\* \* \* \* \*